US009515239B2

(12) United States Patent
Inada et al.

(10) Patent No.: US 9,515,239 B2
(45) Date of Patent: Dec. 6, 2016

(54) LIGHT-EMITTING DEVICE AND LIGHT-EMITTING APPARATUS

(71) Applicant: Panasonic Intellectual Property Management Co., Ltd., Osaka (JP)

(72) Inventors: Yasuhisa Inada, Osaka (JP); Taku Hirasawa, Kyoto (JP); Yoshitaka Nakamura, Osaka (JP); Akira Hashiya, Osaka (JP); Mitsuru Nitta, Osaka (JP); Takeyuki Yamaki, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/618,591

(22) Filed: Feb. 10, 2015

(65) Prior Publication Data

US 2015/0249186 A1 Sep. 3, 2015

(30) Foreign Application Priority Data

Feb. 28, 2014 (JP) ................................ 2014-037992
Aug. 4, 2014 (JP) ................................ 2014-158890

(51) Int. Cl.
*H01L 33/00* (2010.01)
*H01L 33/58* (2010.01)
(Continued)

(52) U.S. Cl.
CPC ............. *H01L 33/58* (2013.01); *H01L 33/505* (2013.01); *H01L 31/02322* (2013.01);
(Continued)

(58) Field of Classification Search
CPC H01L 33/0045; H01S 3/08009; H01S 5/0078; H01S 5/0085; H01S 5/1221; H01S 5/14; H01S 5/18308; H01S 5/18341; H01S 5/18361
(Continued)

(56) References Cited

U.S. PATENT DOCUMENTS 5,732,102 A 3/1998 Bouadma
6,728,034 B1 4/2004 Nakanishi et al.
(Continued)

FOREIGN PATENT DOCUMENTS

JP 9-073807 A 3/1997
JP 11-283751 A 10/1999
(Continued)

OTHER PUBLICATIONS

International Search Report of PCT application No. PCT/JP2015/000810 dated Apr. 7, 2015.
(Continued)

*Primary Examiner* — Tod T Van Roy
*Assistant Examiner* — Vu A Vu
(74) *Attorney, Agent, or Firm* — McDermott Will & Emery LLP

(57) ABSTRACT

A light-emitting device includes a photoluminescent layer that emits light containing first light, and a light-transmissive layer located on or near the photoluminescent layer. A submicron structure is defined on at least one of the photoluminescent layer and the light-transmissive layer. The submicron structure includes at least projections or recesses. The submicron structure has spatial frequency components distributed at least from more than 0 to $2/D_{int}(\min)$ as determined by two-dimensional Fourier transform of a pattern of the projections or recesses and satisfies the following relationship:

$$0.8D_{int}(\min)<\lambda_a/n_{wav\text{-}a}$$

where $D_{int}(\min)$ is the minimum center-to-center distance between adjacent projections or recesses, $\lambda_a$ is the wavelength of the first light in air, and $n_{wav\text{-}a}$ is the refractive index of the photoluminescent layer for the first light.

7 Claims, 27 Drawing Sheets

(51) Int. Cl.
*H01L 33/50* (2010.01)
*H01L 27/118* (2006.01)
*H01L 31/0232* (2014.01)
*H01L 31/12* (2006.01)

(52) U.S. Cl.
CPC ............ *H01L 31/12* (2013.01); *H01L 31/125* (2013.01); *H01L 33/00* (2013.01); *H01L 2027/11853* (2013.01)

(58) Field of Classification Search
USPC ........................................................... 257/98
See application file for complete search history.

(56) References Cited

U.S. PATENT DOCUMENTS

2002/0180348 A1 12/2002 Oda et al.
2003/0021314 A1 1/2003 Yoshida et al.
2003/0169792 A1 9/2003 Kim
2004/0233534 A1 11/2004 Nakanishi et al.
2006/0039433 A1* 2/2006 Simpson ............... H01S 3/0635 372/50.1
2006/0088066 A1 4/2006 He
2007/0031097 A1* 2/2007 Heikenfeld ............ G02B 26/02 385/129
2007/0153860 A1* 7/2007 Chang-Hasnain ... G02B 5/0816 372/50.124
2008/0149916 A1 6/2008 Baba et al.
2008/0258160 A1 10/2008 Do
2009/0021153 A1 1/2009 Lee et al.
2009/0190068 A1 7/2009 Kawamura
2009/0206325 A1 8/2009 Biwa et al.
2009/0267092 A1 10/2009 Fukshima et al.
2009/0286337 A1 11/2009 Lee et al.
2010/0142189 A1 6/2010 Hong et al.
2010/0164365 A1 7/2010 Yoshino et al.
2010/0277887 A1 11/2010 Su et al.
2011/0198645 A1 8/2011 Jo et al.
2012/0018705 A1 1/2012 Takazoe et al.
2012/0119638 A1 5/2012 Sato et al.
2012/0176766 A1 7/2012 Natsumeda
2012/0224378 A1 9/2012 Koike et al.
2012/0286258 A1 11/2012 Naraoka et al.
2013/0069046 A1 3/2013 Ishizuya
2013/0208327 A1 8/2013 Bolle et al.
2013/0277703 A1 10/2013 Matsuzaki
2013/0308102 A1 11/2013 Natsumeda et al.
2014/0022818 A1* 1/2014 Natsumeda ............ H04N 9/315 362/607
2014/0071683 A1 3/2014 Hamada et al.
2014/0092620 A1 4/2014 Tissot
2014/0306176 A1 10/2014 Chiu et al.
2014/0362604 A1 12/2014 Masuda

FOREIGN PATENT DOCUMENTS

JP 2001-059905 A 3/2001
JP 2001-155520 A 6/2001
JP 2007-103901 A 4/2007
JP 2007-240641 A 9/2007
JP 2008-130279 A 6/2008
JP 2008-521211 A 6/2008
JP 2008-227458 A 9/2008
JP 2009-140894 A 6/2009
JP 2010-015874 A 1/2010
JP 2010-033772 A 2/2010
JP 2010-199357 A 9/2010
JP 2010-210824 A 9/2010
JP 2010-231941 10/2010
JP 2011-166148 A 8/2011
JP 2012-093454 A 5/2012
JP 2012-109334 A 6/2012
JP 2012-109400 A 6/2012
JP 2012-182376 A 9/2012
JP 2013-183020 A 9/2013
JP 2014-075584 A 4/2014
JP 2014-092645 A 5/2014
JP 2014-523603 A 9/2014
WO 2007/034827 A1 3/2007
WO 2007/091687 A1 8/2007
WO 2009/099211 A1 8/2009
WO 2011/040528 A1 4/2011
WO 2012/049905 A1 4/2012
WO 2012/108384 A1 8/2012
WO 2012/137584 A1 10/2012
WO 2013/084442 A1 6/2013
WO 2013/125567 A1 8/2013
WO 2013/172025 A1 11/2013
WO 2014/024218 A1 2/2014
WO 2014/119783 A1 8/2014
WO 2015/045886 A1 4/2015

OTHER PUBLICATIONS

International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
Non-Final Office Action issued in U.S. Appl. No. 14/618,254, mailed on Feb. 3, 2016.
Non-Final Office Action issued in U.S. Appl. No. 14/621,729, mailed on Mar. 9, 2016.
Final Office Action issued in U.S. Appl. No. 14/621,729, mailed on Sep. 28, 2016.

* cited by examiner

120Rd 121w, 123b 121b, 122b

LIGHT-EMITTING DEVICE AND LIGHT-EMITTING APPARATUS

BACKGROUND

1. Technical Field

The present disclosure relates to light-emitting devices and light-emitting apparatuses, and particularly to light-emitting devices and light-emitting apparatuses including a photoluminescent layer.

2. Description of the Related Art

Optical devices, such as lighting fixtures, displays, and projectors, that output light in the necessary direction are required for many applications. Photoluminescent materials, such as those used for fluorescent lamps and white light-emitting diodes (LEDs), emit light in all directions. Thus, those materials are used in combination with optical elements such as reflectors and lenses to output light only in a particular direction.

For example, Japanese Unexamined Patent Application Publication No. 2010-231941 discloses an illumination system including a light distributor and an auxiliary reflector to provide sufficient directionality.

SUMMARY

One non-limiting and exemplary embodiment provides a light-emitting device including: a photoluminescent layer that emits light containing first light; and a light-transmissive layer located on or near the photoluminescent layer, wherein a submicron structure is defined on at least one of the photoluminescent layer and the light-transmissive layer, the submicron structure comprising at least projections or recesses, and wherein the submicron structure has spatial frequency components distributed at least from more than 0 to $2/D_{int}(\min)$ as determined by two-dimensional Fourier transform of a pattern of the projections or recesses and satisfies the following relationship:

$$0.8D_{int}(\min)<\lambda_a/n_{wav\text{-}a}$$

where $D_{int}(\min)$ is the minimum center-to-center distance between adjacent projections or recesses, $\lambda_a$ is the wavelength of the first light in air, and $n_{wav\text{-}a}$ is the refractive index of the photoluminescent layer for the first light.

It should be noted that general or specific embodiments may be implemented as a device, an apparatus, a system, a method, or any elective combination thereof.

BRIEF DESCRIPTION OF THE DRAWINGS

FIG. 17A shows a one-dimensional periodic structure having a period $p_x$ in the x direction, FIG. 17B shows a two-dimensional periodic structure having a period $p_x$ in the x direction and a period $p_y$ in the y direction, FIG. 17C shows the wavelength dependence of light absorptivity in the structure in FIG. 17A, and FIG. 17D shows the wavelength dependence of light absorptivity in the structure in FIG. 17B;

FIG. 32A shows the distribution for a pattern with a probability of occurrence of the first unit patterns of 100%, FIG. 32B shows the distribution for a pattern with a probability of occurrence of the first unit patterns of 80%, FIG. 32C shows the distribution for a pattern with a probability of occurrence of the first unit patterns of 70%, and FIG. 32D shows the distribution for a pattern with a probability of occurrence of the first unit patterns of 60%;

DETAILED DESCRIPTION

Figure 1A:
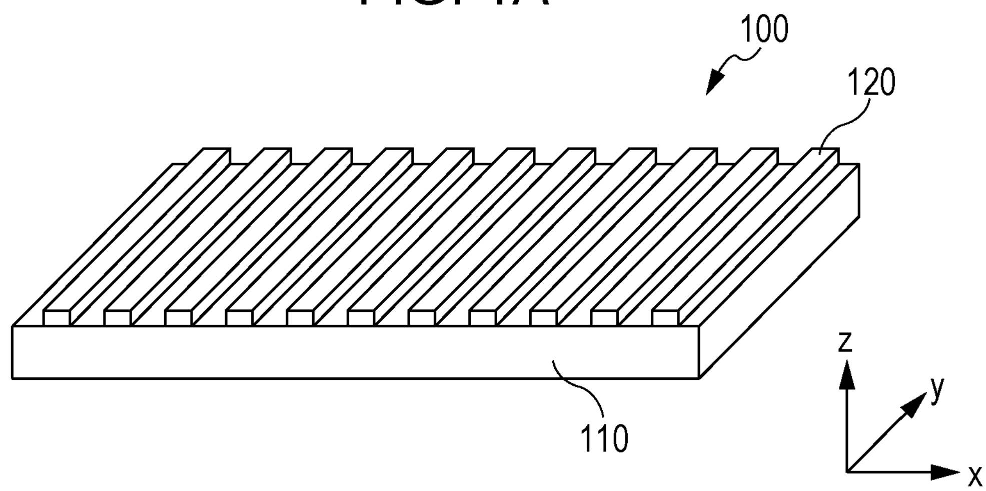
FIG. 1A is a perspective view showing the structure of a light-emitting device according to an embodiment.

Optical devices including optical elements such as reflectors and lenses need to be larger to ensure sufficient space for these optical elements. Accordingly, it is desirable to eliminate or reduce the size of these optical elements.

The present disclosure includes the following light-emitting devices and light-emitting apparatus:

1. A light-emitting device includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses and satisfies the following relationship:

$$\lambda_a/n_{wav\text{-}a}<D_{int}<\lambda_a$$

where $D_{int}$ is the center-to-center distance between adjacent projections or recesses, $\lambda_a$ is the wavelength of the first light in air, and $n_{wav\text{-}a}$ is the refractive index of the photoluminescent layer for the first light. The wavelength $\lambda_a$ is, for example, within the visible wavelength range (e.g., 380 to 780 nm).

In general, the light emitted from the photoluminescent layer is light in a wavelength range including the peak wavelength. The wavelength $\lambda_a$ of the first light need not be the peak wavelength, but may be any wavelength within the emission wavelength range. If the first light is light of a wavelength other than the peak wavelength, light weaker than light of the peak wavelength can be enhanced. Thus, the emission spectrum of the light-emitting device can be changed to output the desired light without changing the material for the photoluminescent layer.

2. In Item 1, the submicron structure may include at least one periodic structure defined by at least the projections or recesses, and the at least one periodic structure may include a first periodic structure satisfying the following relationship:

$$\lambda_a/n_{wav\text{-}a}<p_a<\lambda_a$$

where $p_a$ is the period of the first periodic structure.

3. In Item 1 or 2, the refractive index $n_{t\text{-}a}$ of the light-transmissive layer for the first light may be lower than the refractive index $n_{wav\text{-}a}$ of the photoluminescent layer for the first light.

4. In any one of Items 1 to 3, the first light may have the maximum intensity in a first direction determined in advance by the submicron structure.

5. In Item 4, the first direction may be normal to the photoluminescent layer.

6. In Item 4 or 5, the first light output in the first direction may be linearly polarized light.

7. In any one of Items 4 to 6, the angle of directionality of the first light with respect to the first direction may be less than 15°.

8. In any one of Items 4 to 7, second light having a wavelength $\lambda_b$ different from the wavelength $\lambda_a$ of the first light may have the maximum intensity in a second direction different from the first direction.

9. In any one of Items 1 to 8, the light-transmissive layer may have the submicron structure.

10. In any one of Items 1 to 9, the photoluminescent layer may have the submicron structure.

11. In any one of Items 1 to 8, the photoluminescent layer may have a flat main surface, and the light-transmissive layer may be located on the flat main surface of the photoluminescent layer and may have the submicron structure.

12. In Item 11, the light-emitting device may further include a transparent substrate that supports the photoluminescent layer.

13. In any one of Items 1 to 8, the light-transmissive layer may be a transparent substrate having the submicron structure on a main surface thereof, and the photoluminescent layer may be located on the submicron structure.

14. In Item 1 or 2, the refractive index $n_{t\text{-}a}$ of the light-transmissive layer for the first light may be higher than or equal to the refractive index $n_{wav\text{-}a}$ of the photoluminescent layer for the first light, and each of the projections or recesses in the submicron structure may have a height or depth of 150 nm or less.

15. In any one of Items 1 and 3 to 14, the submicron structure may include at least one periodic structure defined by at least the projections or recesses, and the at least one periodic structure may include a first periodic structure satisfying the following relationship:

$$\lambda_a/n_{wav\text{-}a}<p_a<\lambda_a$$

where $p_a$ is the period of the first periodic structure. The first periodic structure may be a one-dimensional periodic structure.

16. In Item 15, the light emitted from the photoluminescent layer may contain second light having a wavelength $\lambda_b$ different from the wavelength $\lambda_a$ in air, and the at least one periodic structure may further include a second periodic structure satisfying the following relationship:

$$\lambda_b/n_{wav\text{-}b}<p_b<\lambda_b$$

where $n_{wav\text{-}b}$ is the refractive index of the photoluminescent layer for the second light, and $p_b$ is the period of the second periodic structure. The second periodic structure may be a one-dimensional periodic structure.

17. In any one of Items 1 and 3 to 14, the submicron structure may include at least two periodic structures defined by at least the projections or recesses, and the at least two periodic structures may include a two-dimensional periodic structure having periodicity in different directions.

18. In any one of Items 1 and 3 to 14, the submicron structure may include periodic structures defined by at least the projections or recesses, and the periodic structures may include periodic structures arranged in a matrix.

19. In any one of Items 1 and 3 to 14, the submicron structure may include periodic structures defined by at least the projections or recesses, and the periodic structures may include a periodic structure satisfying the following relationship:

$$\lambda_{ex}/n_{wav\text{-}ex}<p_{ex}<\lambda_{ex}$$

where $p_{ex}$ is the period of the periodic structure, $\lambda_{ex}$ is the wavelength, in air, of excitation light for a photoluminescent material contained in the photoluminescent layer, and $n_{wav\text{-}ex}$ is the refractive index of the photoluminescent layer for the excitation light.

20. A light-emitting device includes photoluminescent layers and light-transmissive layers. At least two of the photoluminescent layers are each independently the photoluminescent layer according to any one of Items 1 to 19, and at least two of the light-transmissive layers are each independently the light-transmissive layer according to any one of Items 1 to 19.

21. In Item 20, the photoluminescent layers and the light-transmissive layers may be stacked on top of each other.

22. A light-emitting device includes a photoluminescent layer, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. Light is directed into the photoluminescent layer and the light-transmissive layer to form a quasi-guided mode.

23. A light-emitting device includes a waveguide layer capable of guiding light and a periodic structure located on or near the waveguide layer. The waveguide layer contains a photoluminescent material. The waveguide layer forms a quasi-guided mode in which light emitted from the photoluminescent material is guided while interacting with the periodic structure.

24. A light-emitting apparatus includes the light-emitting device according to any one of Items 1 to 23 and an excitation light source that irradiates the photoluminescent layer with excitation light.

25. A light-emitting device includes a photoluminescent layer, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses and satisfies the following relationship:

$$\lambda_{ex}/n_{wav\text{-}ex}<D_{int}<\lambda_{ex}$$

where $D_{int}$ is the center-to-center distance between adjacent projections or recesses, $\lambda_{ex}$ is the wavelength, in air, of excitation light for a photoluminescent material contained in the photoluminescent layer, and $n_{wav\text{-}ex}$ is the refractive index, for the excitation light, of a medium having the highest refractive index of media present in an optical path to the photoluminescent layer or the light-transmissive layer.

26. In Item 25, the submicron structure may include at least one periodic structure defined by at least the projections or recesses, and the at least one periodic structure may include a first periodic structure satisfying the following relationship:

$$\lambda_{ex}/n_{wav\text{-}ex}<p_{ex}<\lambda_{ex}$$

where $p_{ex}$ is the period of the first periodic structure.

27. A light-emitting device includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses. The submicron structure has spatial frequency components distributed at least from more than 0 to $2/D_{int}$(min) as determined by two-dimensional Fourier transform of a pattern of the projections or recesses and satisfies the following relationship:

$$0.8D_{int}(\text{min})<\lambda_a/n_{wav\text{-}a}$$

where $D_{int}$(min) is the minimum center-to-center distance between adjacent projections or recesses, $\lambda_a$ is the wavelength of the first light in air, and $n_{wav\text{-}a}$ is the refractive index of the photoluminescent layer for the first light.

28. In Item 27, the submicron structure may further satisfy the following relationship:

$$\lambda_a<3D_{int}(\text{min})$$

29. A light-emitting device includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses and satisfies the following relationship:

$$\lambda_a/n_{wav\text{-}a}<P_{max}<\lambda_a$$

where $\lambda_a$ is the wavelength of the first light in air, $n_{wav\text{-}a}$ is the refractive index of the photoluminescent layer for the first light, and $P_{max}$ is the period corresponding to a spatial frequency that gives the maximum intensity in a distribution of intensity of spatial frequency components determined by two-dimensional Fourier transform of a pattern of the projections or recesses.

30. In Item 29, the submicron structure may have spatial frequency components distributed at least from more than 0 to $2/D_{int}$(min) and may satisfy the following relationship:

$$P_{max}=D_{int}(\text{min})$$

where $D_{int}$(min) is the minimum center-to-center distance between adjacent projections or recesses.

31. A light-emitting apparatus includes the light-emitting device according to any one of Items 27 to 30; and a light source that directs excitation light into the light-emitting device.

32. A light-emitting device includes a photoluminescent layer that emits light containing first light, and a light-transmissive layer having a higher refractive index than the photoluminescent layer. A submicron structure is defined on the light-transmissive layer, the submicron structure comprising at least projections or recesses. The submicron structure satisfies the following relationship:

$$\lambda_a/n_{wav\text{-}a}<p_{max}<\lambda_a$$

where $\lambda_a$ is the wavelength of the first light in air, $n_{wav\text{-}a}$ is the refractive index of the photoluminescent layer for the first light, and $P_{max}$ is the period corresponding to a spatial frequency that gives the maximum intensity in a distribution of intensity of spatial frequency components determined by two-dimensional Fourier transform of a pattern of the projections or recesses.

33. In Item 32, a distance between the submicron structure and the photoluminescent layer may be more than $\lambda_a/2$.

34. A light-emitting device includes a light-transmissive layer on which a submicron structure is defined, and a photoluminescent layer that is located on or near the submicron structure and emits light containing first light. The submicron structure comprises at least projections or recesses, and the submicron structure satisfies the following relationship:

$$\lambda_a/n_{wav\text{-}a}<p_{max}<\lambda_a$$

where $\lambda_a$ is the wavelength of the first light in air, $n_{wav\text{-}a}$ is the refractive index of the photoluminescent layer for the first light, and $P_{max}$ is the period corresponding to a spatial frequency that gives the maximum intensity in a distribution of intensity of spatial frequency components determined by two-dimensional Fourier transform of a pattern of the projections or recesses.

35. A light-emitting device includes a photoluminescent layer that emits light containing first light. A submicron structure is defined on the photoluminescent layer, the submicron structure comprising at least projections or recesses. The submicron structure satisfies the following relationship:

$$\lambda_a/n_{wav\text{-}a}<p_{max}<\lambda_a$$

where $\lambda_a$ is the wavelength of the first light in air, $n_{wav\text{-}a}$ is the refractive index of the photoluminescent layer for the first light, and $P_{max}$ is the period corresponding to a spatial frequency that gives the maximum intensity in a distribution of intensity of spatial frequency components determined by two-dimensional Fourier transform of a pattern of the projections or recesses.

A light-emitting device according to an embodiment of the present disclosure includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses. The submicron structure satisfies the following relationship:

$$\lambda_a/n_{wav\text{-}a}<D_{int}<\lambda_a$$

where $D_{int}$ is the center-to-center distance between adjacent projections or recesses, $\lambda_a$ is the wavelength of the first light in air, and $n_{wav\text{-}a}$ is the refractive index of the photoluminescent layer for the first light. The wavelength $\lambda_a$ is, for example, within the visible wavelength range (e.g., 380 to 780 nm).

The photoluminescent layer contains a photoluminescent material. The term "photoluminescent material" refers to a material that emits light in response to excitation light. This term encompasses fluorescent materials and phosphorescent materials in a narrow sense, encompasses inorganic materials and organic materials (e.g., dyes), and encompasses quantum dots (i.e., tiny semiconductor particles). The photoluminescent layer may contain a matrix material (host material) in addition to the photoluminescent material. Examples of matrix materials include resins and inorganic materials such as glasses and oxides.

The light-transmissive layer located on or near the photoluminescent layer is made of a material with high transmittance to the light emitted from the photoluminescent layer. Examples of such materials include inorganic materials and resins. For example, the light-transmissive layer is desirably made of a dielectric (particularly, an insulator with low light absorption). For example, the light-transmissive layer may be a substrate that supports the photoluminescent layer. Alternatively, if the surface of the photoluminescent layer facing air has the submicron structure, the air layer can serve as the light-transmissive layer.

In the light-emitting device according to the embodiment of the present disclosure, the submicron structure (e.g., a periodic structure) defined on at least one of the photoluminescent layer and the light-transmissive layer forms a unique electric field distribution inside the photoluminescent layer and the light-transmissive layer, as described in detail later with reference to the results of calculations and experiments. This electric field distribution, also termed "quasi-guided mode", is due to the interaction of guided light with the submicron structure. The quasi-guided mode can be utilized to improve the luminous efficiency, directionality, and polarization selectivity of photoluminescence, as described later. Although the term "quasi-guided mode" is used in the following description to describe novel structures and/or mechanisms contemplated by the inventors, this description is for illustrative purposes only and is not intended to limit the present disclosure in any wav.

For example, the submicron structure includes projections and satisfies the relationship $\lambda_a/n_{wav-a}<D_{int}<\lambda_a$, where $D_{int}$ is the center-to-center distance between adjacent projections. Instead of the projections, the submicron structure may include recesses. For simplicity, the following description will be directed to a submicron structure including projections. The symbol $\lambda$ is the wavelength of light, and the symbol $\lambda_a$ is the wavelength of light in air. The symbol $n_{wav}$ is the refractive index of the photoluminescent layer. If the photoluminescent layer is a medium containing materials, the refractive index $n_{wav}$ is the average refractive index of the materials weighted by their respective volume fractions. Although it is preferable to use the symbol $n_{wav-a}$ to refer to the refractive index of the photoluminescent layer for light of the wavelength $\lambda_a$ because the refractive index n generally depends on the wavelength, it may be abbreviated for simplicity. The symbol $n_{wav}$ is basically the refractive index of the photoluminescent layer; however, if a layer having a higher refractive index than the photoluminescent layer is adjacent to the photoluminescent layer, the refractive index $n_{wav}$ is the average refractive index of the layer having a higher refractive index and the photoluminescent layer weighted by their respective volume fractions. This is optically equivalent to a photoluminescent layer composed of layers of different materials.

The effective refractive index $n_{eff}$ of the medium for light in the quasi-guided mode satisfies $n_a<n_{eff}<n_{wav}$, where $n_a$ is the refractive index of air. If light in the quasi-guided mode is assumed to be light propagating through the photoluminescent layer while being totally reflected at an angle of incidence $\theta$, the effective refractive index $n_{eff}$ can be written as $n_{eff}=n_{wav} \sin \theta$. The effective refractive index $n_{eff}$ is determined by the refractive index of the medium present in the region where the electric field of the quasi-guided mode is distributed. For example, if the submicron structure is defined by the light-transmissive layer, the effective refractive index $n_{eff}$ depends not only on the refractive index of the photoluminescent layer, but also on the refractive index of the light-transmissive layer. Because the electric field distribution also varies depending on the polarization direction of the quasi-guided mode (i.e., the TE mode or the TM mode), the effective refractive index $n_{eff}$ can differ between the TE mode and the TM mode.

The submicron structure is defined on at least one of the photoluminescent layer and the light-transmissive layer. If the photoluminescent layer and the light-transmissive layer are in contact with each other, the submicron structure may be defined on the interface between the photoluminescent layer and the light-transmissive layer. In this case, the photoluminescent layer and the light-transmissive layer have the submicron structure. Alternatively, the light-transmissive layer located on or near the photoluminescent layer may have the submicron structure without the photoluminescent layer having the submicron structure. When the submicron structure of the light-transmissive layer is said to be near the photoluminescent layer, or one layer is said to be near another layer, the distance therebetween is typically half the wavelength $\lambda_a$ or less. This allows the electric field of a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer. If the light-transmissive layer has a higher refractive index than the photoluminescent layer, light reaches the light-transmissive layer even if the above relationship is not satisfied.

The submicron structure, which satisfies the relationship $\lambda_a/n_{wav-a}<D_{int}<\lambda_a$, as described above, is characterized by a submicron size. The submicron structure includes, for example, at least one periodic structure, as in the light-emitting devices according to the embodiments described in detail later. The at least one periodic structure satisfies the relationship $\lambda_a/n_{wav-a}<p_a<\lambda_a$, where $p_a$ is the period of the at least one periodic structure. That is, the submicron structure includes a periodic structure in which the center-to-center distance $D_{int}$ between adjacent projections is constant at $p_a$. If the submicron structure includes such a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (i.e., repeatedly totally reflected) while interacting with the periodic structure. This efficiently diffracts the light even if the periodic structure causes a small phase shift (i.e., even if the periodic structure has a small height).

The above mechanism can be utilized to improve the luminous efficiency of photoluminescence by the enhancement of the electric field due to the quasi-guided mode and also to couple the emitted light into the quasi-guided mode. The angle of travel of the light in the quasi-guided mode is varied by the angle of diffraction determined by the periodic structure. This can be utilized to output light of a particular wavelength in a particular direction (i.e., significantly improve the directionality). Furthermore, high polarization selectivity can be simultaneously achieved because the effective refractive index $n_{eff}$ ($=n_{wav}$ sin θ) differs between the TE mode and the TM mode. For example, as demonstrated by the experimental examples below, a light-emitting device can be provided that outputs intense linearly polarized light (e.g., the TM mode) of a particular wavelength (e.g., 610 nm) in the front direction. The angle of directionality of the light output in the front direction is, for example, less than 15°. The term "angle of directionality" refers to the angle of one side with respect to the front direction, which is assumed to be 0°.

Conversely, a submicron structure having a lower periodicity results in a lower directionality, luminous efficiency, polarization, and wavelength selectivity. The periodicity of the submicron structure may be adjusted depending on the need. The periodic structure may be a one-dimensional periodic structure, which has a higher polarization selectivity, or a two-dimensional periodic structure, which allows for a lower polarization.

The submicron structure may include periodic structures. For example, these periodic structures may have different periods or different periodic directions (axes). The periodic structures may be defined on the same plane or may be stacked on top of each other. The light-emitting device may include photoluminescent layers and light-transmissive layers, and they may have submicron structures.

The submicron structure can be used not only to control the light emitted from the photoluminescent layer, but also to efficiently guide excitation light into the photoluminescent layer. That is, the excitation light can be diffracted and coupled into the quasi-guided mode to guide light in the photoluminescent layer and the light-transmissive layer by the submicron structure to efficiently excite the photoluminescent layer. A submicron structure may be used that satisfies the relationship $\lambda_{ex}/n_{wav\text{-}ex}<D_{int}<\lambda_{ex}$, where $\lambda_{ex}$ is the wavelength, in air, of the light that excites the photoluminescent material, and $n_{wav\text{-}ex}$ is the refractive index of the photoluminescent layer for the excitation light. The symbol $n_{wav\text{-}ex}$ is the refractive index of the photoluminescent layer for the emission wavelength of the photoluminescent material. Alternatively, a submicron structure may be used that includes a periodic structure satisfying the relationship $\lambda_{ex}/n_{wav\text{-}ex}<p_{ex}<\lambda_{ex}$, where $p_{ex}$ is the period of the periodic structure. The excitation light has a wavelength $\lambda_{ex}$ of, for example, 450 nm, although it may have a shorter wavelength than visible light. If the excitation light has a wavelength within the visible range, it may be output together with the light emitted from the photoluminescent layer.

1. Underlying Knowledge Forming Basis of the Present Disclosure

The underlying knowledge forming the basis for the present disclosure will be described before describing specific embodiments of the present disclosure. As described above, photoluminescent materials such as those used for fluorescent lamps and white LEDs emit light in all directions and thus require optical elements such as reflectors and lenses to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that the light emitted from the photoluminescent layer is localized in a particular direction. Based on Fermi's golden rule, the emission rate F, which is a measure characterizing light emission, is represented by equation (1):

$$\Gamma(r) = \frac{2\pi}{\hbar}\langle(d\cdot E(r))\rangle^2\rho(\lambda) \tag{1}$$

In equation (1), r is the vector indicating the position, λ is the wavelength of light, d is the dipole vector, E is the electric field vector, and ρ is the density of states. For many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $<(d\cdot E(r))>^2$ does not depend on the direction. Accordingly, the emission rate F is constant irrespective of the direction. Thus, in most cases, the photoluminescent layer emits light in all directions.

As can be seen from equation (1), to achieve anisotropic light emission, it is necessary to align the dipole vector d in a particular direction or to enhance the component of the electric field vector in a particular direction. One of these approaches can be employed to achieve directional light emission. In the present disclosure, the results of a detailed study and analysis on structures for utilizing a quasi-guided mode in which the electric field component in a particular direction is enhanced by the confinement of light in the photoluminescent layer will be described below.

2. Structure for Enhancing Only Electric Field in Particular Direction

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material outputs little or no light in the front direction because the emitted light is coupled into a guided mode. Accordingly, the inventors have investigated the possibility of combining a waveguide containing a photoluminescent material with a periodic structure (including at least projections or recesses). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure to undergo diffraction so that the light in this mode is converted into light propagating in a particular direction and can thus be output from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
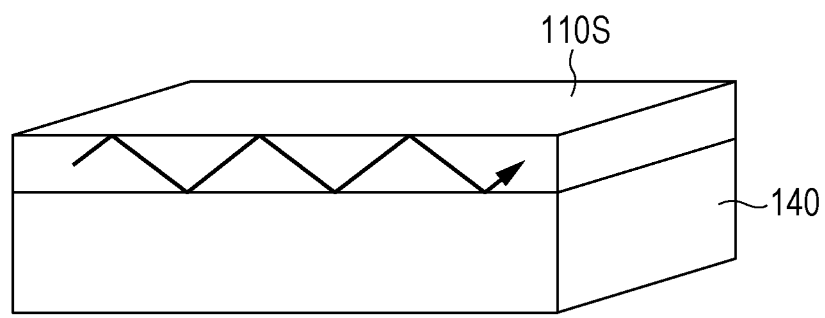
FIG. 30 is a schematic perspective view of an example slab waveguide.

As a simple waveguide structure, the inventors have studied slab waveguides. A slab waveguide has a planar structure in which light is guided. FIG. 30 is a schematic perspective view of an example slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of the light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of layers, a quasi-guided mode is formed as long as the electric field of the guided mode reaches the periodic structure. Not all of the photoluminescent layer needs to be made of a photoluminescent material; it may be a layer including at least a region that functions to emit light.

If the periodic structure is made of a metal, a mode due to the guided mode and plasmon resonance is formed. This mode has different properties from the quasi-guided mode described above and is less effective in enhancing emission because a large loss occurs due to high absorption by the metal. Thus, it is desirable to form the periodic structure using a dielectric with low absorption.

Figure 1B:
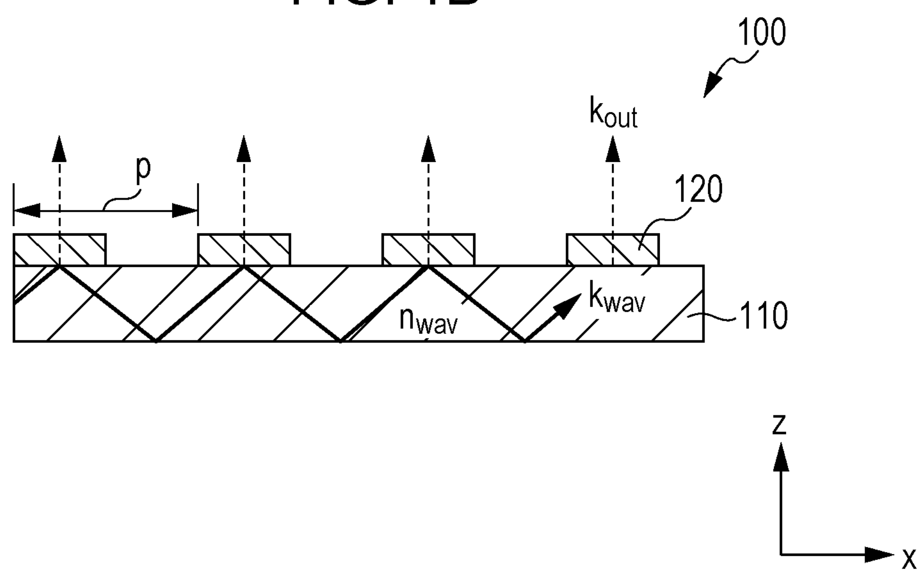
FIG. 1B is a partial sectional view of the light-emitting device shown in FIG. 1A.

The inventors have studied the coupling of light into a quasi-guided mode that can be output as light propagating in a particular angular direction using a periodic structure formed on a waveguide (e.g. photoluminescent layer). FIG. 1A is a schematic perspective view of an example light-emitting device 100 including a waveguide (e.g. photoluminescent layer) 110 and a periodic structure (e.g. light-transmissive layer) 120. The light-transmissive layer 120 may be hereinafter referred to as "periodic structure 120" if the light-transmissive layer 120 forms a periodic structure. (i.e. submicron structure is defined on the light-transmissive layer 120.) In this example, the periodic structure 120 is a one-dimensional periodic structure in which stripe-shaped projections extending in the y direction are arranged at regular intervals in the x direction. FIG. 1B is a sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by equation (2):

$$k_{out} = k_{wav} - m\frac{2\pi}{p} \tag{2}$$

where m is an integer indicating the diffraction order.

For simplicity, the light guided in the waveguide 110 is assumed to be a ray of light propagating at an angle $\theta_{wav}$. This approximation gives equations (3) and (4):

$$\frac{k_{wav}\lambda_0}{2\pi} = n_{wav}\sin\theta_{wav} \tag{3}$$

$$\frac{k_{out}\lambda_0}{2\pi} = n_{out}\sin\theta_{out} \tag{4}$$

In these equations, $\lambda_0$ is the wavelength of the light in air, $n_{wav}$ is the refractive index of the waveguide 110, $n_{out}$ is the refractive index of the medium from which the light is output, and $\theta_{out}$ is the angle at which the light is output from the waveguide 110 to a substrate or air. From equations (2) to (4), the output angle $\theta_{out}$ can be represented by equation (5):

$$n_{out}\sin\theta_{out} = n_{wav}\sin\theta_{wav} - m\lambda_0/p \tag{5}$$

If $n_{wav}\sin\theta_{wav} = m\lambda_0/p$ in equation (5), $\theta_{out}=0$, meaning that the light can be output in the direction perpendicular to the plane of the waveguide 110 (i.e., in the front direction).

Based on this principle, light can be coupled into a particular quasi-guided mode and be converted into light having a particular output angle using the periodic structure to output intense light in that direction.

There are some constraints to achieving the above situation. To form a quasi-guided mode, the light propagating through the waveguide 110 has to be totally reflected. The conditions therefor are represented by inequality (6):

$$n_{out} < n_{wav}\sin\theta_{wav} \tag{6}$$

To diffract the quasi-guided mode using the periodic structure and thereby output the light from the waveguide 110, $-1<\sin\theta_{out}<1$ has to be satisfied in equation (5). Hence, inequality (7) has to be satisfied:

$$-1 < \frac{n_{wav}}{n_{out}}\sin\theta_{wav} - \frac{m\lambda_0}{n_{out}p} < 1 \tag{7}$$

Taking into account inequality (6), inequality (8) may be satisfied:

$$\frac{m\lambda_0}{2n_{out}} < p \tag{8}$$

To output the light from the waveguide 110 in the front direction (i.e., $\theta_{out}=0$), as can be seen from equation (5), equation (9) has to be satisfied:

$$p = m\lambda_0/(n_{wav}\sin\theta_{wav}) \tag{9}$$

As can be seen from equation (9) and inequality (6), the required conditions are represented by inequality (10):

$$\frac{m\lambda_0}{n_{wav}} < p < \frac{m\lambda_0}{n_{out}} \tag{10}$$

If the periodic structure 120 as shown in FIGS. 1A and 1B is provided, it may be designed based on first-order diffracted light (i.e., m=1) because higher-order diffracted light (i.e., m≥2) has low diffraction efficiency. In this embodiment, the period p of the periodic structure 120 is determined so as to satisfy inequality (11), which is given by substituting m=1 into inequality (10):

$$\frac{\lambda_0}{n_{wav}} < p < \frac{\lambda_0}{n_{out}} \quad (11)$$

If the waveguide (photoluminescent layer) 110 is not in contact with a transparent substrate, as shown in FIGS. 1A and 1B, $n_{out}$ is equal to the refractive index of air (i.e., about 1.0). Thus, the period p may be determined so as to satisfy inequality (12):

$$\frac{\lambda_0}{n_{wav}} < p < \lambda_0 \quad (12)$$

Figure 1C:
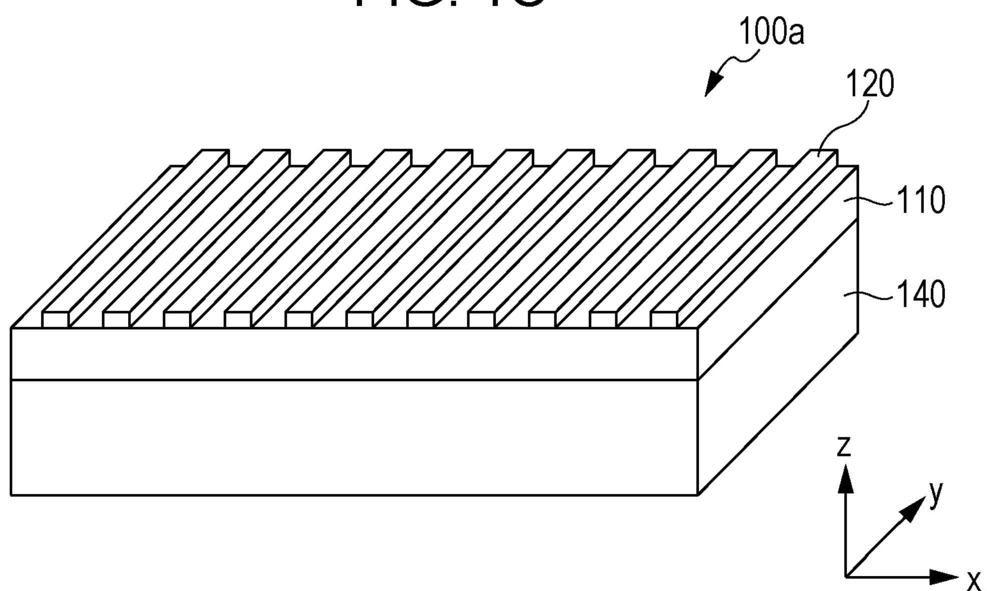
FIG. 1C is a perspective view showing the structure of a light-emitting device according to another embodiment.
Figure 1D:
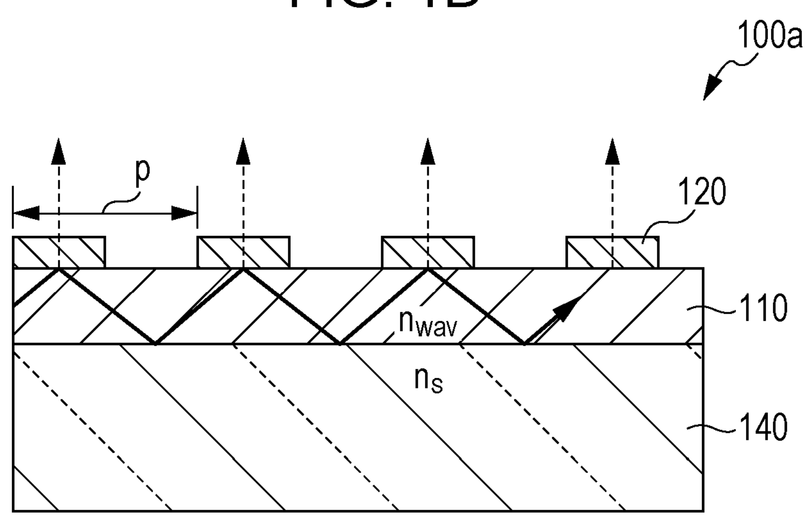
FIG. 1D is a partial sectional view of the light-emitting device shown in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p may be determined so as to satisfy inequality (13), which is given by substituting $n_0=n_s$ into inequality (11):

$$\frac{\lambda_0}{n_{wav}} < p < \frac{\lambda_0}{n_s} \quad (13)$$

Although m=1 is assumed in inequality (10) to give inequalities (12) and (13), m≥2 may be assumed. That is, if both surfaces of the light-emitting device 100 are in contact with air layers, as shown in FIGS. 1A and 1B, the period p may be determined so as to satisfy inequality (14):

$$\frac{m\lambda_0}{n_{wav}} < p < m\lambda_0 \quad (14)$$

where m is an integer of 1 or more.

Similarly, if the photoluminescent layer 110 is formed on the transparent substrate 140, as in the light-emitting device 100*a* shown in FIGS. 1C and 1D, the period p may be determined so as to satisfy inequality (15):

$$\frac{m\lambda_0}{n_{wav}} < p < \frac{m\lambda_0}{n_s} \quad (15)$$

By determining the period p of the periodic structure so as to satisfy the above inequalities, the light emitted from the photoluminescent layer 110 can be output in the front direction, thus providing a directional light-emitting device.

3. Verification by Calculations 3-1. Period and Wavelength Dependence

The inventors verified, by optical analysis, whether the output of light in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
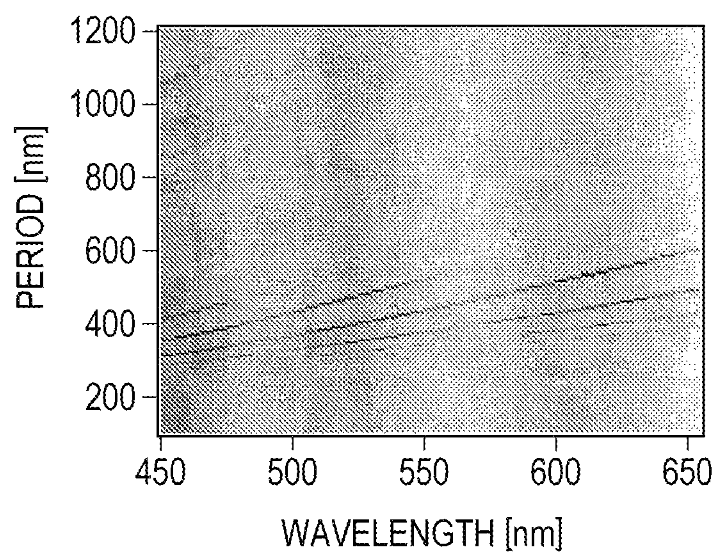
FIG. 2 is a graph showing the results of calculations of the enhancement of light output in the front direction with varying emission wavelengths and varying periods of a periodic structure.

FIG. 2 shows the results of calculations of the enhancement of light output in the front direction with varying emission wavelengths and varying periods of the periodic structure, where the photoluminescent layer was assumed to have a thickness of 1 μm and a refractive index $n_{wav}$ of 1.8, and the periodic structure was assumed to have a height of 50 nm and a refractive index of 1.5. In these calculations, the periodic structure was assumed to be a one-dimensional periodic structure uniform in the y direction, as shown in FIG. 1A, and the polarization of the light was assumed to be the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
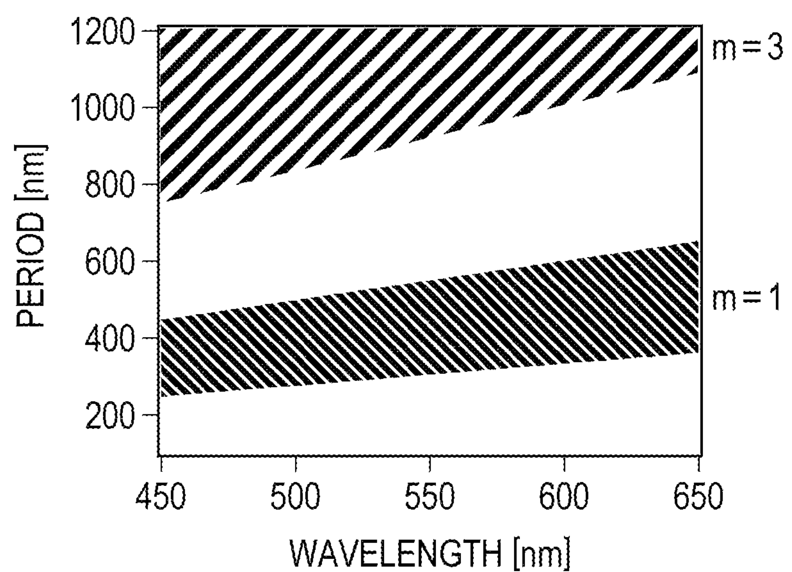
FIG. 3 is a graph illustrating the conditions for m=1 and m=3 in inequality (10)

In the above calculations, the periodic structure was assumed to have a rectangular cross section as shown in FIG. 1B. FIG. 3 is a graph illustrating the conditions for m=1 and m=3 in inequality (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, lines are observed in each of the regions corresponding to m=1 and m=3 in FIG. 3. This indicates the presence of quasi-guided modes.

3-2. Thickness Dependence

Figure 4:
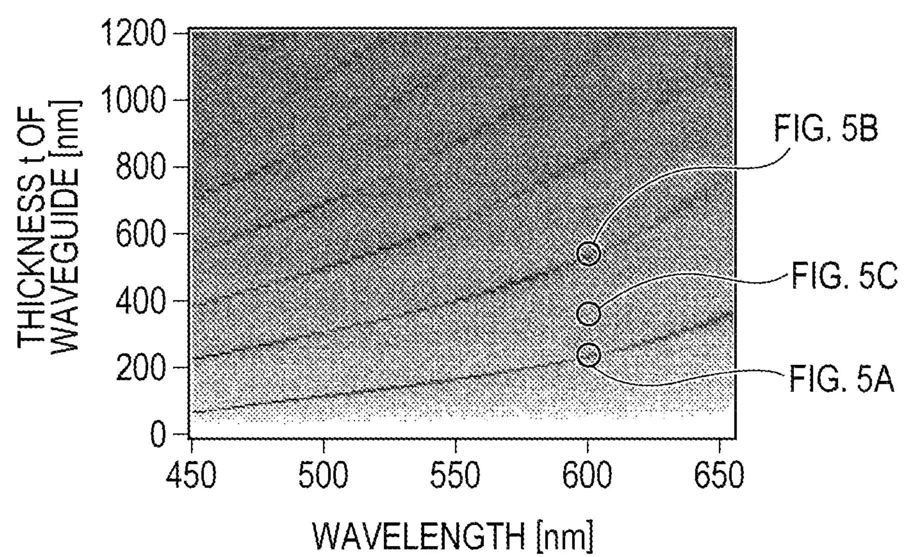
FIG. 4 is a graph showing the results of calculations of the enhancement of light output in the front direction with varying emission wavelengths and varying thicknesses t of a photoluminescent layer.

FIG. 4 is a graph showing the results of calculations of the enhancement of light output in the front direction with varying emission wavelengths and varying thicknesses t of the photoluminescent layer, where the photoluminescent layer was assumed to have a refractive index $n_{wav}$ of 1.8, and the periodic structure was assumed to have a period of 400 nm, a height of 50 nm, and a refractive index of 1.5. FIG. 4 shows that the enhancement of the light peaks at a particular thickness t the photoluminescent layer.

Figure 5A:
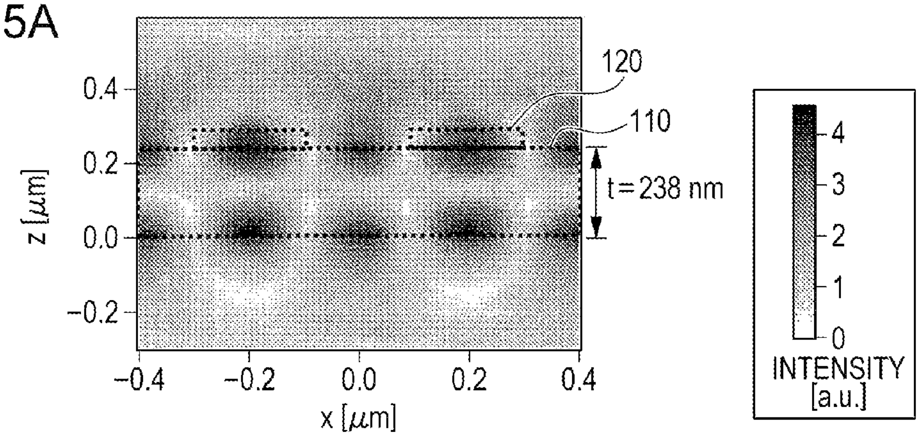
FIG. 5A is a graph showing the results of calculations of the electric field distribution of a mode to guide light in the x direction for a thickness t of 238 nm.
Figure 5B:
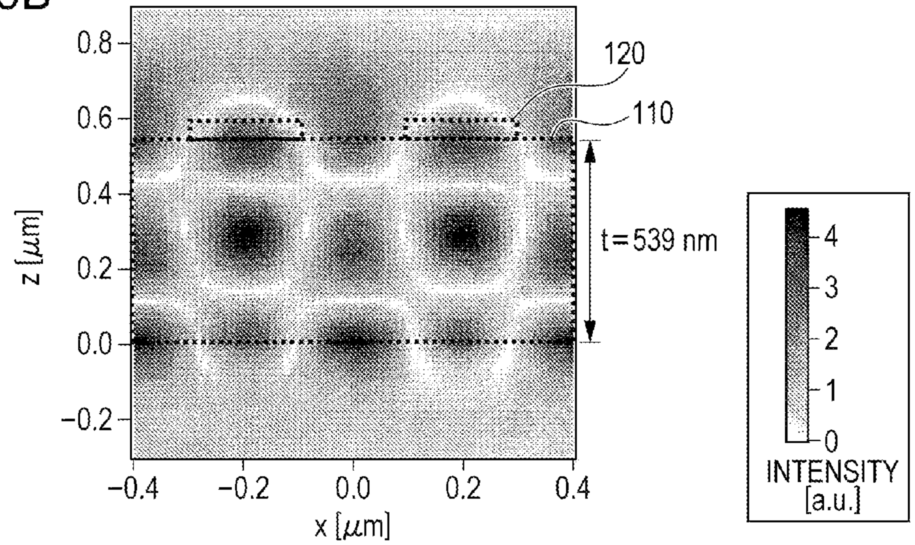
FIG. 5B is a graph showing the results of calculations of the electric field distribution of a mode to guide light in the x direction for a thickness t of 539 nm.
Figure 5C:
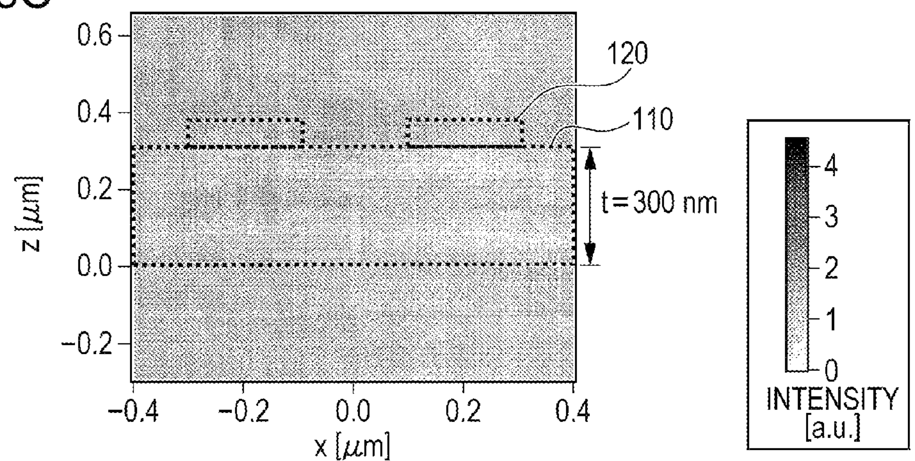
FIG. 5C is a graph showing the results of calculations of the electric field distribution of a mode to guide light in the x direction for a thickness t of 300 nm.

FIGS. 5A and 5B show the results of calculations of the electric field distributions of a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm shows low electric field intensity as a whole. This is because there are guided modes for t=238 nm and t=539 nm so that light is strongly confined. Furthermore, regions with the highest electric field intensity (i.e., antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ in the number of nodes (white regions) of the electric field in the z direction by one.

3-3. Polarization Dependence

Figure 6:
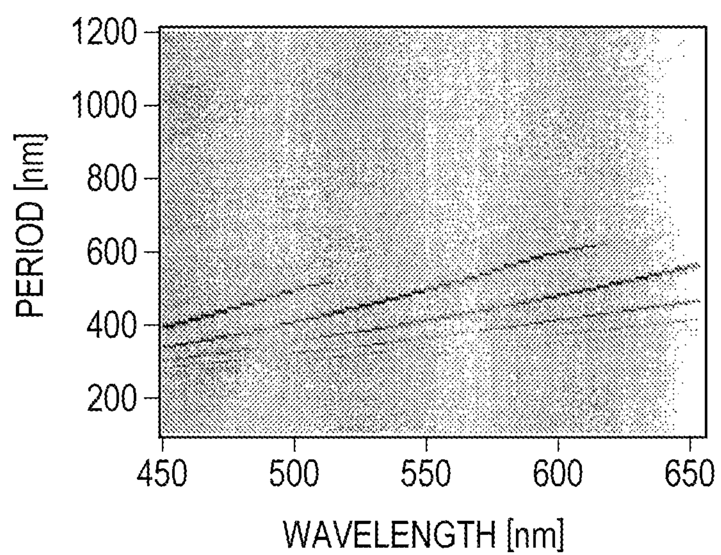
FIG. 6 is a graph showing the results of calculations of the enhancement of light performed under the same conditions as in FIG. 2 except that the polarization of the light was assumed to be the TE mode, which has an electric field component perpendicular to the y direction.

To examine the polarization dependence, the enhancement of light was calculated under the same conditions as in FIG. 2 except that the polarization of the light was assumed to be the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both of the TM mode and the TE mode.

3-4. Two-Dimensional Periodic Structure

Figure 7A:
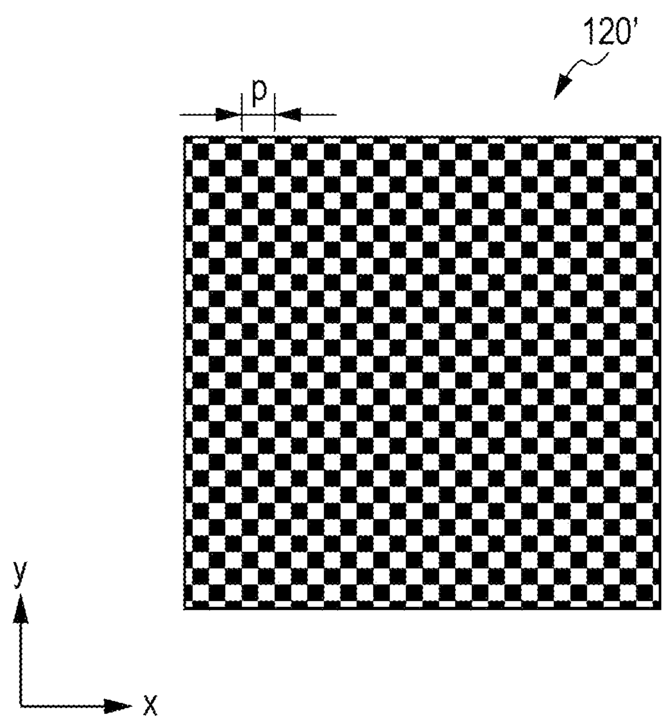
FIG. 7A is a plan view of an example two-dimensional periodic structure.
Figure 7B:
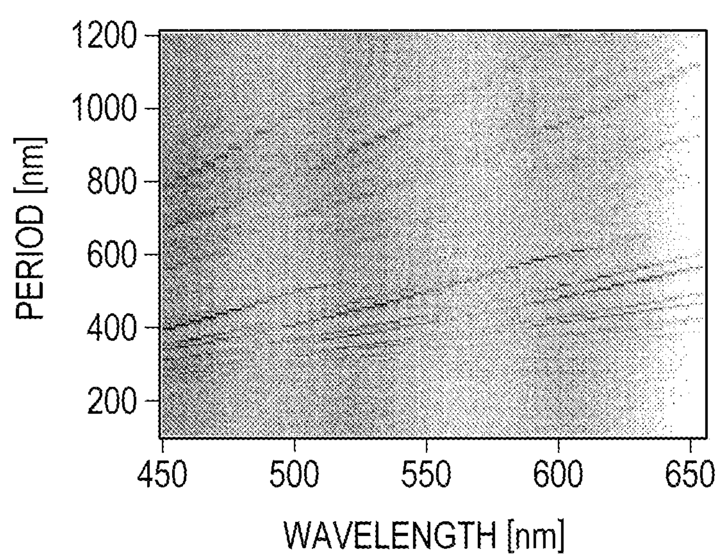
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both of the x direction and the y direction. In FIG. 7A, the black regions indicate the projections, and the white regions indicate the recesses. For a two-dimensional periodic structure, both of the diffraction in the x direction and the diffraction in the y direction have to be taken into account. Although the diffraction in only the x direction or the y direction is similar to that in a one-dimensional periodic structure, a two-dimensional periodic structure can be expected to give different results from a one-dimensional periodic structure because diffraction also occurs in a direction containing both of an x component and a y component (e.g., a direction inclined at 45°). FIG. 7B shows the results of calculations of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, the diffraction that simultaneously satisfies the first-order diffraction conditions in both of the x direction and the y direction also has to be taken into account. Such diffracted light is output in the direction at the angle corresponding to $\sqrt{2}$ times (i.e., $2^{1/2}$ times) the period p. Thus, peaks will occur at $\sqrt{2}$ times the period p in addition to peaks that occur in a one-dimensional periodic structure. Such peaks are observed in FIG. 7B.

Figure 18A:
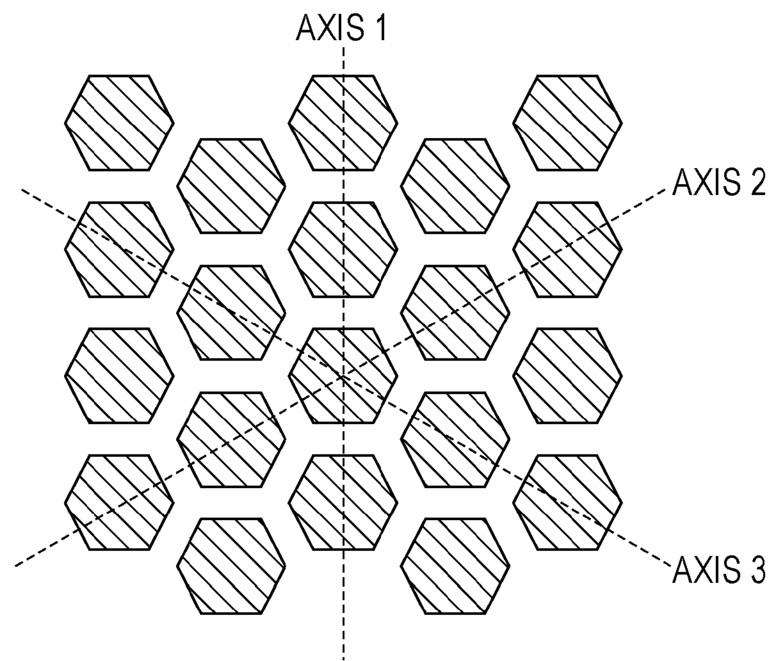
FIG. 18A is a schematic view of an example two-dimensional periodic structure.
Figure 18B:
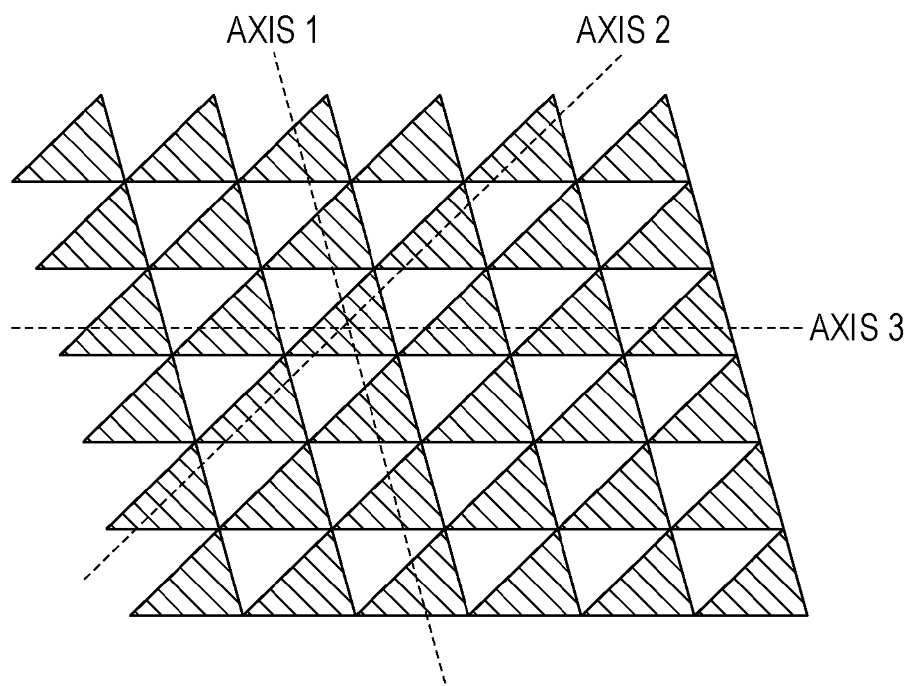
FIG. 18B is a schematic view of another example two-dimensional periodic structure.

The two-dimensional periodic structure does not have to be a square grid structure having equal periods in the x direction and the y direction, as shown in FIG. 7A, but may be a hexagonal grid structure, as shown in FIG. 18A, or a triangular grid structure, as shown in FIG. 18B. The two-dimensional periodic structure may have different periods in different directions (e.g., in the x direction and the y direction for a square grid structure).

In this embodiment, as demonstrated above, light in a characteristic quasi-guided mode formed by the periodic structure and the photoluminescent layer can be selectively output only in the front direction through diffraction by the periodic structure. With this structure, the photoluminescent layer can be excited with excitation light such as ultraviolet light or blue light to output directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
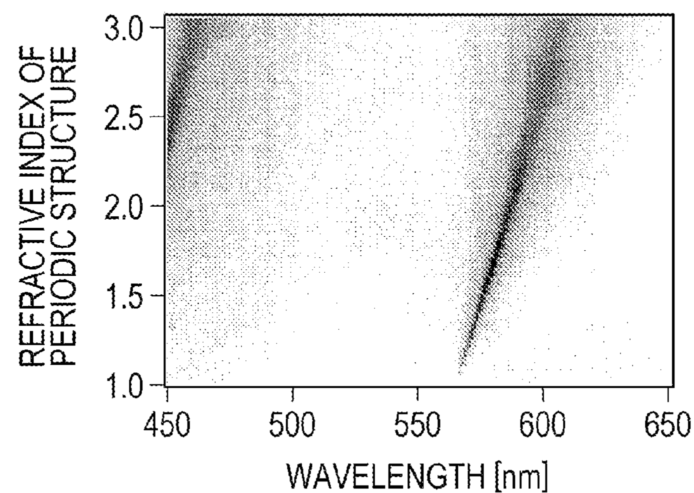
FIG. 8 is a graph showing the results of calculations of the enhancement of light output in the front direction with varying emission wavelengths and varying refractive indices of the periodic structure.
Figure 9:
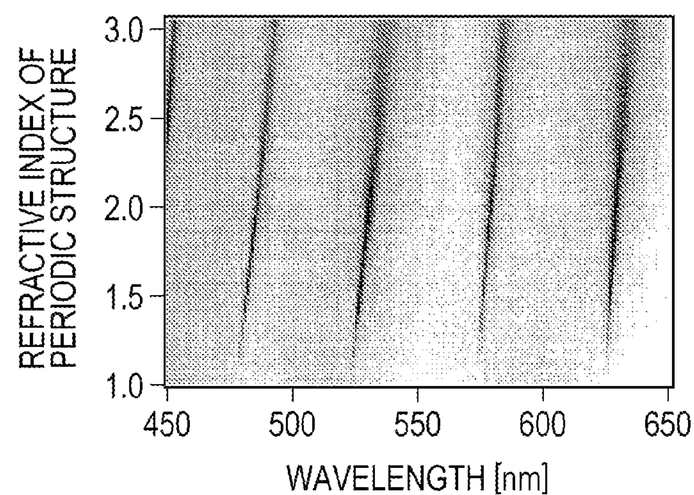
FIG. 9 is a graph showing the results obtained under the same conditions as in FIG. 8 except that the photoluminescent layer was assumed to have a thickness of 1,000 nm.

The refractive index of the periodic structure was studied. In the calculations performed herein, the photoluminescent layer was assumed to have a thickness of 200 nm and a refractive index $n_{wav}$ of 1.8, the periodic structure was assumed to be a one-dimensional periodic structure uniform in the y direction, as shown in FIG. 1A, having a height of 50 nm and a period of 400 nm, and the polarization of the light was assumed to be the TM mode, which has an electric field component parallel to the y direction. FIG. 8 shows the results of calculations of the enhancement of light output in the front direction with varying emission wavelengths and varying refractive indices of the periodic structure. FIG. 9 shows the results obtained under the same conditions except that the photoluminescent layer was assumed to have a thickness of 1,000 nm.

The results show that a photoluminescent layer with a thickness of 1,000 nm (FIG. 9) results in a smaller shift in the wavelength at which the light intensity peaks (i.e., peak wavelength) with the change in the refractive index of the periodic structure than a photoluminescent layer with a thickness of 200 nm (FIG. 8). This is because the quasi-guided mode is more affected by the refractive index of the periodic structure as the photoluminescent layer is thinner. Specifically, a periodic structure with a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure with a higher refractive index results in a broader peak and a lower intensity. This is because a periodic structure with a higher refractive index outputs light in the quasi-guided mode at a higher rate and is therefore less effective in confining the light, i.e., has a lower Q value. To maintain a high peak intensity, a structure may be employed in which light is moderately output using a quasi-guided mode that is effective in confining the light (i.e., has a high Q value). This means that it is undesirable to use a periodic structure made of a material having a much higher refractive index than the photoluminescent layer. Thus, to achieve a high peak intensity and Q value, the periodic structure (i.e., the light-transmissive layer) may be made of a dielectric having a refractive index lower than or similar to that of the photoluminescent layer. This is also true if the photoluminescent layer contains materials other than photoluminescent materials.

4-2. Height of Periodic Structure

Figure 10:
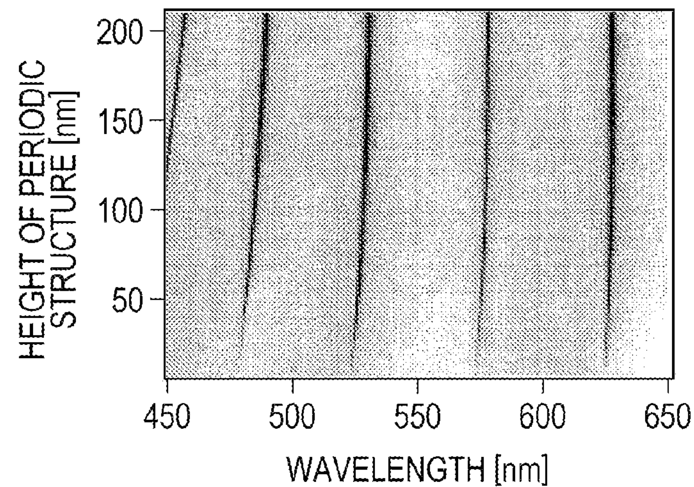
FIG. 10 is a graph showing the results of calculations of the enhancement of light output in the front direction with varying emission wavelengths and varying heights of the periodic structure.
Figure 11:
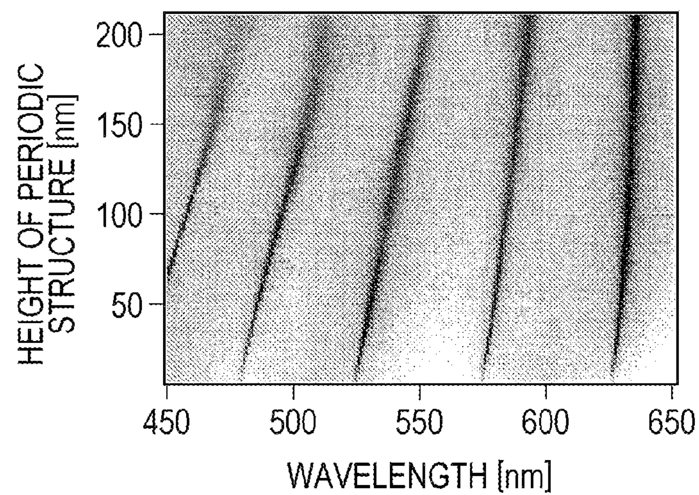
FIG. 11 is a graph showing the results of calculations performed under the same conditions as in FIG. 10 except that the periodic structure was assumed to have a refractive index $n_p$ of 2.0.

The height of the periodic structure was then studied. In the calculations performed herein, the photoluminescent layer was assumed to have a thickness of 1,000 nm and a refractive index $n_{wav}$ of 1.8, the periodic structure was assumed to be a one-dimensional periodic structure uniform in the y direction, as shown in FIG. 1A, having a refractive index $n_p$ of 1.5 and a period of 400 nm, and the polarization of the light was assumed to be the TM mode, which has an electric field component parallel to the y direction. FIG. 10 shows the results of calculations of the enhancement of light output in the front direction with varying emission wavelengths and varying heights of the periodic structure. FIG. 11 shows the results of calculations performed under the same conditions except that the periodic structure was assumed to have a refractive index $n_p$ of 2.0. Whereas the results in FIG. 10 show that the peak intensity and the Q value (i.e., the peak line width) do not change above a certain height of the periodic structure, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), the light is totally reflected, and only a leaking (i.e., evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), the light reaches the surface of the periodic structure without being totally reflected and is therefore more influenced by a periodic structure with a larger height. As shown in FIG. 11, a height of about 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
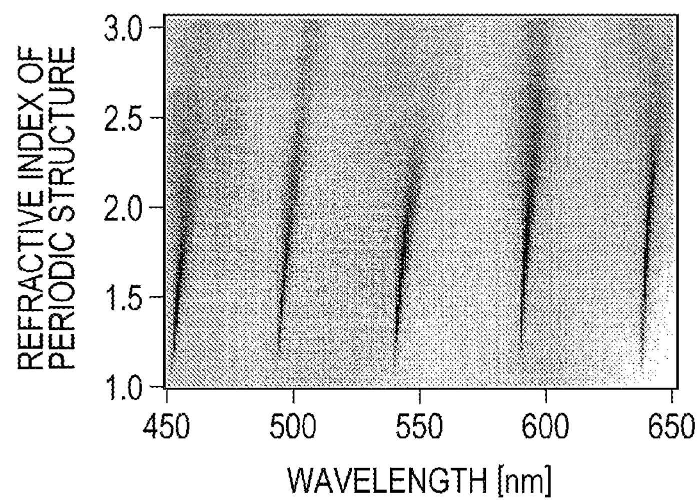
FIG. 12 is a graph showing the results of calculations performed under the same conditions as in FIG. 9 except that the polarization of the light was assumed to be the TE mode, which has an electric field component perpendicular to the y direction.

The polarization direction was then studied. FIG. 12 shows the results of calculations performed under the same conditions as in FIG. 9 except that the polarization of the light was assumed to be the TE mode, which has an electric field component perpendicular to the y direction. The TE mode is more influenced by the periodic structure than the TM mode because the electric field of the quasi-guided mode leaks more largely for the TE mode than for the TM mode. Thus, the peak intensity and the Q value decrease more significantly for the TE mode than for the TM mode if the refractive index $n_p$ of the periodic structure is higher than the refractive index $n_{wav}$ of the photoluminescent layer.

4-4. Refractive Index of Photoluminescent Layer

Figure 13:
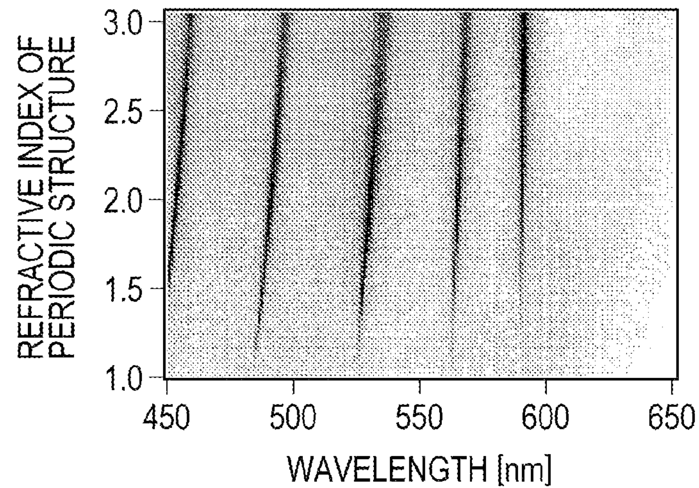
FIG. 13 is a graph showing the results of calculations performed under the same conditions as in FIG. 9 except that the photoluminescent layer was assumed to have a refractive index $n_{wav}$ of 1.5.

The refractive index of the photoluminescent layer was then studied. FIG. 13 shows the results of calculations performed under the same conditions as in FIG. 9 except that the photoluminescent layer was assumed to have a refractive index $n_{wav}$ of 1.5. The results for the photoluminescent layer having a refractive index $n_{wav}$ of 1.5 are similar to the results in FIG. 9. However, light of a wavelength of 600 nm or more was not output in the front direction. This is because, from inequality (10), $\lambda_0 < n_{wav} \times p/m = 1.5 \times 400\ \text{nm}/1 = 600$ nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modifications

Modifications of this embodiment will now be described.

5-1. Structure Including Substrate

As described above, the light-emitting device may have a structure in which the photoluminescent layer 110 and the periodic structure 120 are formed on the transparent substrate 140, as shown in FIGS. 1C and 1D. Such a light-emitting device 100*a* may be fabricated by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to output light in a particular direction. If the transparent substrate 140 is provided in contact with the photoluminescent layer 110, the period p has to be set so as to satisfy inequality (15), which is given by replacing the refractive index $n_{out}$ of the output medium in inequality (10) by $n_s$.

Figure 14:
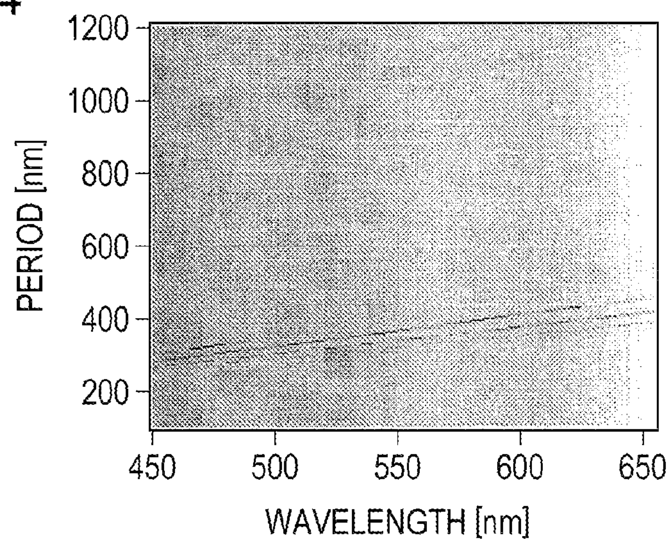
FIG. 14 is a graph showing the results of calculations performed under the same conditions as in FIG. 2 except that the photoluminescent layer and the periodic structure were assumed to be located on a transparent substrate having a refractive index of 1.5.
Figure 15:
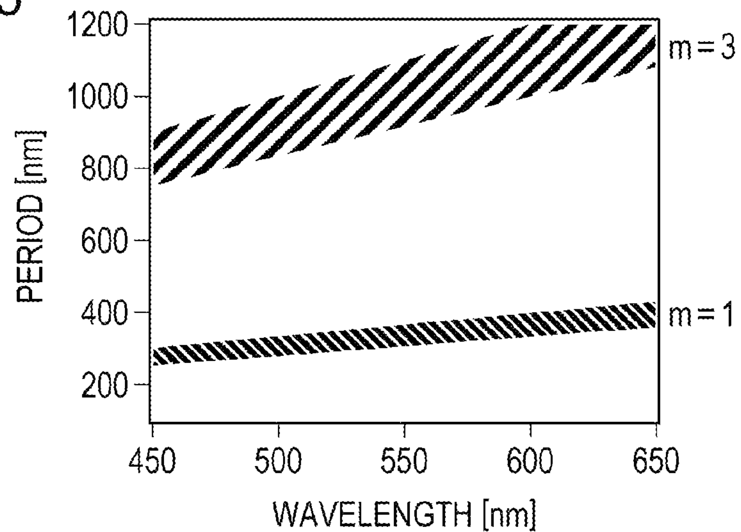
FIG. 15 is a graph illustrating the conditions represented by inequality (15)

To demonstrate this, calculations were performed under the same conditions as in FIG. 2 except that the photoluminescent layer 110 and the periodic structure 120 were assumed to be located on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the conditions represented by inequality (15), which is given by substituting $n_{out}=n_s$ into inequality (10). In FIG. 14, light intensity peaks are observed in the regions corresponding to the ranges shown in FIG. 15.

Thus, for the light-emitting device 100*a*, in which the photoluminescent layer 110 and the periodic structure 120 are located on the transparent substrate 140, a period p that satisfies inequality (15) is effective, and a period p that satisfies inequality (13) is significantly effective.

5-2. Light-Emitting Apparatus Including Excitation Light Source

Figure 16:
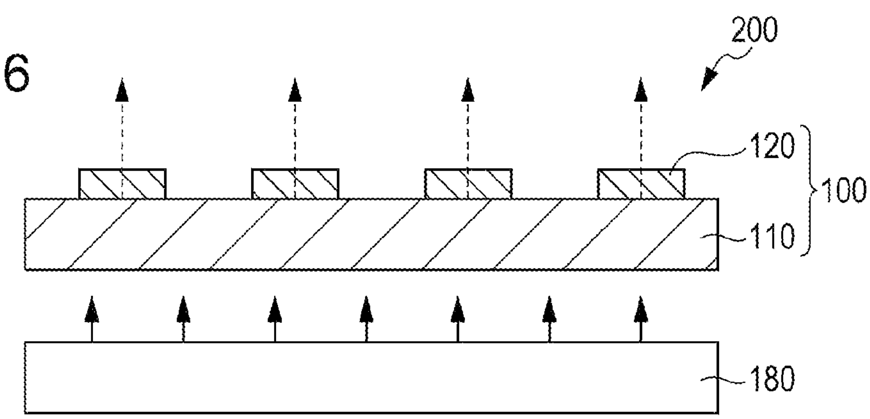
FIG. 16 is a schematic view of an example light-emitting apparatus including the light-emitting device shown in FIGS. 1A and 1B and a light source that directs excitation light into the photoluminescent layer.

FIG. 16 is a schematic view of an example light-emitting apparatus 200 including the light-emitting device 100 shown in FIGS. 1A and 1B and a light source 180 that directs excitation light into the photoluminescent layer 110. In this embodiment, as described above, the photoluminescent layer can be excited with excitation light such as ultraviolet light or blue light to output directional light. The light source 180 can be configured to emit such excitation light to provide a directional light-emitting apparatus 200. Although the wavelength of the excitation light emitted from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
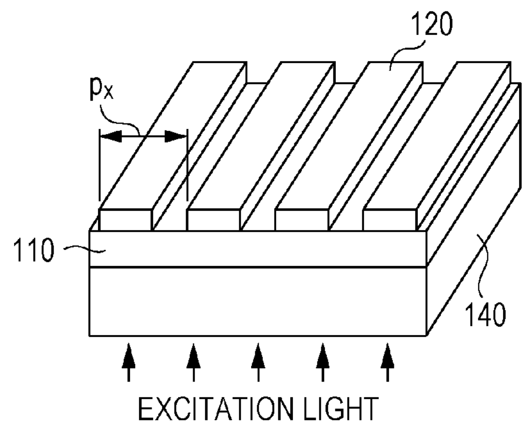
FIGS. 17A to 17D illustrate structures in which excitation light is coupled into a quasi-guided mode to efficiently output light.
Figure 17B:
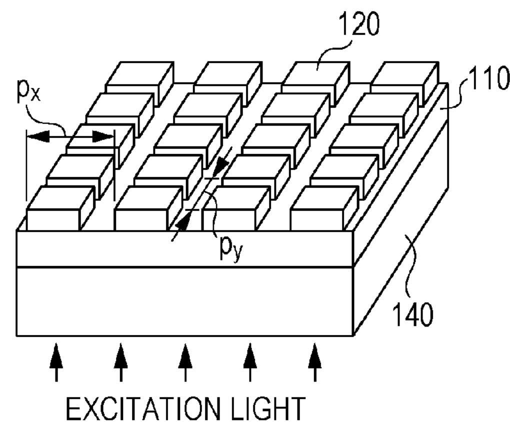

The excitation light may be coupled into a quasi-guided mode to efficiently output light. This method is illustrated in FIGS. 17A to 17D. In this example, as in the structure shown in FIGS. 1C and 1D, the photoluminescent layer 110 and the periodic structure 120 are formed on the transparent substrate 140. As shown in FIG. 17A, the period $p_x$ in the x direction is first determined so as to enhance light emission. As shown in FIG. 17B, the period $p_y$ in the y direction is then determined so as to couple the excitation light into a quasi-guided mode. The period $p_x$ is determined so as to satisfy the conditions given by replacing p in inequality (10) by $p_x$. The period $p_y$ is determined so as to satisfy inequality (16):

$$\frac{m\lambda_{ex}}{n_{wav}} < p_y < \frac{m\lambda_{ex}}{n_{out}} \tag{16}$$

where m is an integer of 1 or more, $\lambda_{ex}$ is the wavelength of the excitation light, and $n_{out}$ is the refractive index of the medium having the highest refractive index of the media in contact with the photoluminescent layer 110 except the periodic structure 120.

In the example in FIGS. 17A and 17B, $n_{out}$ is the refractive index $n_s$ of the transparent substrate 140. For a structure including no transparent substrate 140, as illustrated in FIG. 16, $n_{out}$ is the refractive index of air (i.e., about 1.0).

In particular, the excitation light can be more effectively converted into a quasi-guided mode if m=1, i.e., if the period $p_y$ is determined so as to satisfy inequality (17):

$$\frac{\lambda_{ex}}{n_{wav}} < p_y < \frac{\lambda_{ex}}{n_{out}} \tag{17}$$

Thus, the excitation light can be converted into a quasi-guided mode if the period $p_y$ is set so as to satisfy the conditions represented by inequality (16) (particularly, the conditions represented by inequality (17)). As a result, the photoluminescent layer 110 can efficiently absorb the excitation light of the wavelength $\lambda_{ex}$.

Figure 17C:
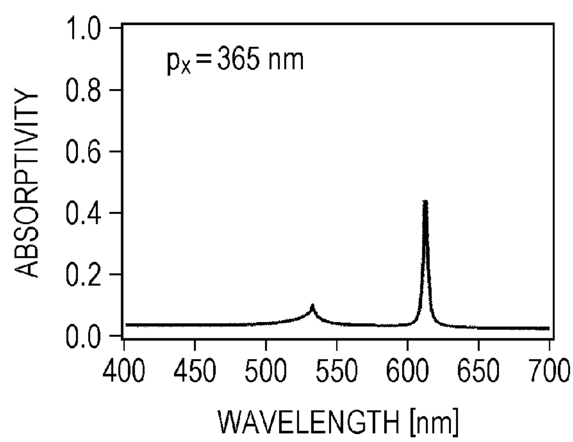
Figure 17D:
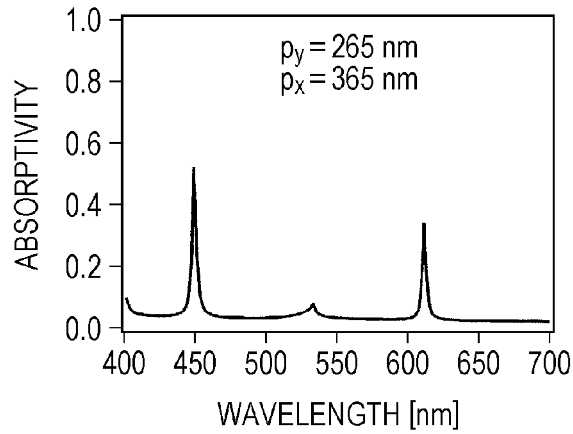

FIGS. 17C and 17D are the results of calculations of the proportion of absorbed light to light incident on the structures shown in FIGS. 17A and 17B, respectively, for each wavelength. In these calculations, $p_x$=365 nm, $p_y$=265 nm, the photoluminescent layer 110 was assumed to have an emission wavelength $\lambda_a$ of about 600 nm, the excitation light was assumed to have a wavelength $\lambda_{ex}$ of about 450 nm, and the photoluminescent layer 110 was assumed to have an extinction coefficient of 0.003. As shown in FIG. 17D, the photoluminescent layer 110 has high absorptivity not only for the light emitted from the photoluminescent layer 110, but also for the excitation light, i.e., light of a wavelength of about 450 nm. This indicates that the incident light is effectively converted into a quasi-guided mode to increase the proportion of the light absorbed into the photoluminescent layer 110. The photoluminescent layer 110 also has high absorptivity for the emission wavelength, i.e., about 600 nm. This indicates that light of a wavelength of about 600 nm incident on this structure is similarly effectively converted into a quasi-guided mode. The periodic structure 120 shown in FIG. 17B is a two-dimensional periodic structure including structures having different periods (i.e., different periodic components) in the x direction and the y direction. Such a two-dimensional periodic structure including periodic components allows for high excitation efficiency and high output intensity. Although the excitation light is incident on the transparent substrate 140 in FIGS. 17A and 17B, the same effect can be achieved if the excitation light is incident on the periodic structure 120.

Also available are two-dimensional periodic structures including periodic components as shown in FIGS. 18A and 18B. The structure shown in FIG. 18A includes periodically arranged projections having a hexagonal planar shape. The structure shown in FIG. 18B includes periodically arranged projections having a triangular planar shape. These structures have major axes (axes 1 to 3 in the examples in FIGS. 18A and 18B) that can be assumed to be periods. Thus, different periods can be assigned to different axial directions. These periods may be set so as to increase the directionality of light of different wavelengths or to efficiently absorb the excitation light. In any case, each period is set so as to satisfy the conditions corresponding to inequality (10).

5-3. Periodic Structure on Transparent Substrate

Figure 19A:
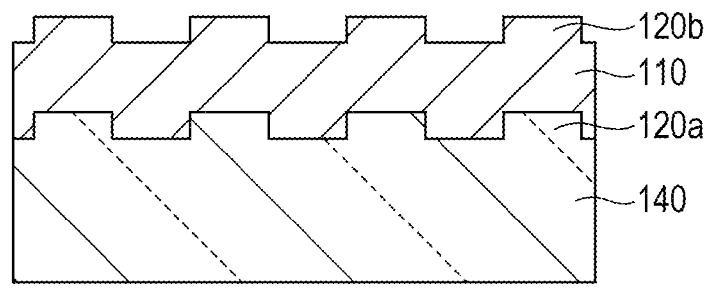
FIG. 19A is a schematic view of a modification in which the periodic structure is formed on the transparent substrate.
Figure 19B:
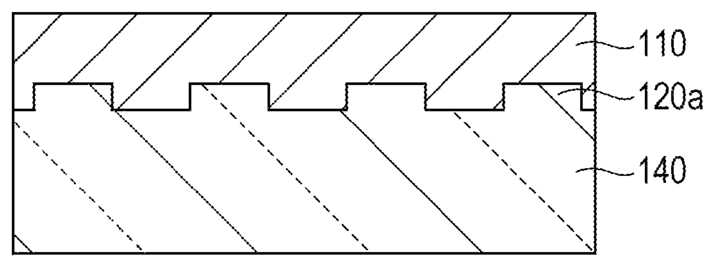
FIG. 19B is a schematic view of another modification in which the periodic structure is formed on the transparent substrate.

As shown in FIGS. 19A and 19B, a periodic structure 120*a* may be formed on the transparent substrate 140, and the photoluminescent layer 110 may be located thereon. In the example in FIG. 19A, the photoluminescent layer 110 is formed along the texture of the periodic structure 120*a* on the transparent substrate 140. As a result, a periodic structure 120*b* with the same period is formed in the surface of the photoluminescent layer 110. In the example in FIG. 19B, the surface of the photoluminescent layer 110 is planarized. In these examples, directional light emission can be achieved by setting the period p of the periodic structure 120*a* so as to satisfy inequality (15).

Figure 19C:
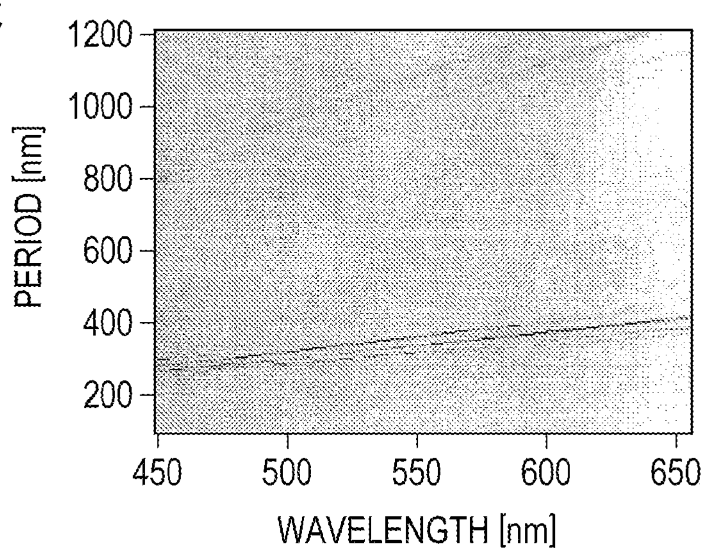
FIG. 19C is a graph showing the results of calculations of the enhancement of light output from the structure in FIG. 19A in the front direction with varying emission wavelengths and varying periods of the periodic structure.

To verify the effect of these structures, the enhancement of light output from the structure in FIG. 19A in the front direction was calculated with varying emission wavelengths and varying periods of the periodic structure. In these calculations, the photoluminescent layer 110 was assumed to have a thickness of 1,000 nm and a refractive index $n_{wav}$ of 1.8, the periodic structure 120*a* was assumed to be a one-dimensional periodic structure uniform in the y direction having a height of 50 nm, a refractive index $n_p$ of 1.5, and a period of 400 nm, and the polarization of the light was assumed to be the TM mode, which has an electric field component parallel to the y direction. FIG. 19C shows the results of these calculations. In these calculations, light intensity peaks were observed at the periods that satisfy the conditions represented by inequality (15).

5-4. Powder

According to the above embodiment, light of any wavelength can be enhanced by adjusting the period of the periodic structure and the thickness of the photoluminescent layer. For example, if the structure shown in FIGS. 1A and 1B is formed using a photoluminescent material that emits light over a wide wavelength range, only light of a certain wavelength can be enhanced. Accordingly, the structure of the light-emitting device 100 as shown in FIGS. 1A and 1B may be provided in powder form for use as a fluorescent material. Alternatively, the light-emitting device 100 as shown in FIGS. 1A and 1B may be embedded in resin or glass.

Figure 20:
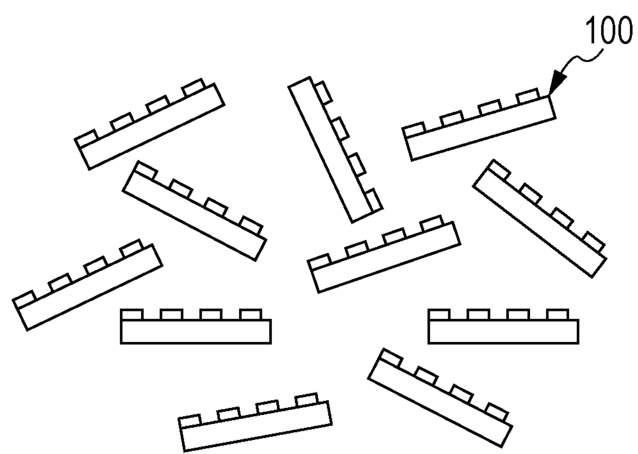
FIG. 20 is a schematic view of a mixture of light-emitting devices in powder form.

The single structure as shown in FIGS. 1A and 1B can output only light of a certain wavelength in a particular direction and is therefore not suitable for outputting, for example, white light, which has a wide wavelength spectrum. Accordingly, as shown in FIG. 20, light-emitting devices 100 that differ in the conditions such as the period of the periodic structure and the thickness of the photoluminescent layer may be mixed in powder form to provide a light-emitting apparatus with a wide wavelength spectrum. In this case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 21:
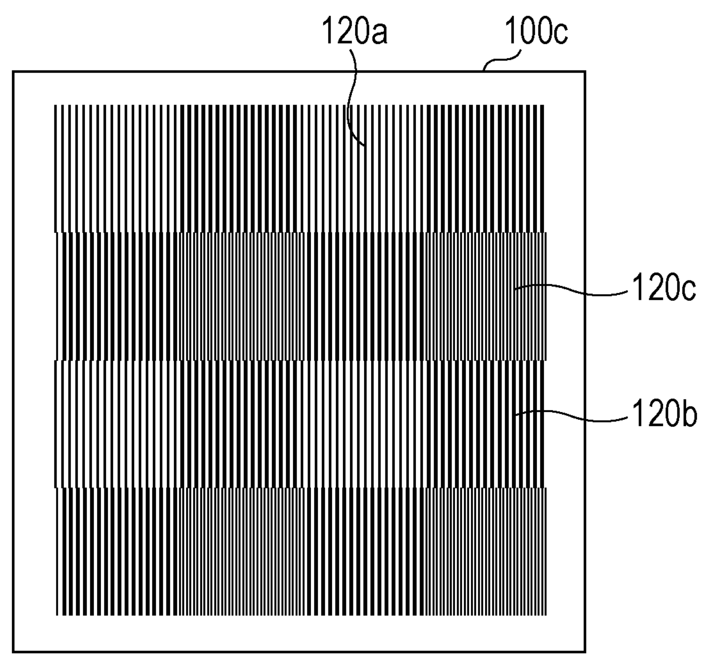
FIG. 21 is a plan view of an example two-dimensional array of periodic structures having different periods on the photoluminescent layer.

FIG. 21 is a plan view of an example two-dimensional array of periodic structures having different periods on the photoluminescent layer. In this example, three types of periodic structures 120*a*, 120*b*, and 120*c* are arranged without any space therebetween. The periods of the periodic structures 120*a*, 120*b*, and 120*c* are set so as to output, for example, light in the red, green, and blue wavelength ranges, respectively, in the front direction. Thus, structures having different periods can be arranged on the photoluminescent layer to output directional light with a wide wavelength spectrum. The periodic structures are not necessarily configured as described above, but may be configured in any manner.

5-6. Layered Structure

Figure 22:
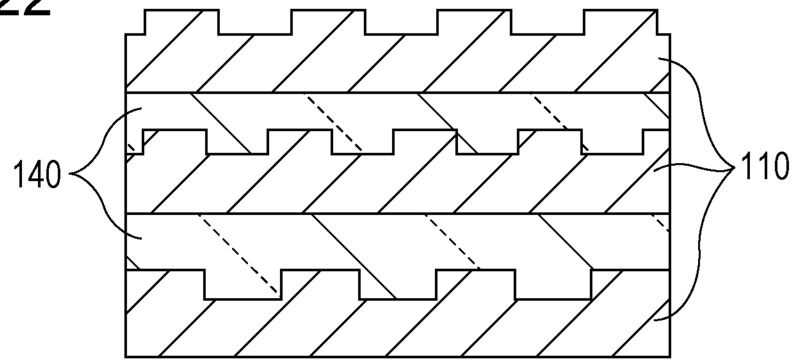
FIG. 22 is a graph showing an example light-emitting device having a layered structure including photoluminescent layers having a texture formed thereon.

FIG. 22 shows an example light-emitting device having a layered structure including photoluminescent layers 110 having a texture formed thereon and transparent substrates 140 between the photoluminescent layers 110. The texture formed on the photoluminescent layer 110 in each layer corresponds to a periodic structure. The example in FIG. 22 includes three periodic structures having different periods. The periods of these periodic structures are set so as to output light in the red, green, and blue wavelength ranges in the front direction. The photoluminescent layer 110 in each layer is made of a material that emits light of the color corresponding to the period of the periodic structure in that layer. Thus, periodic structures having different periods can be stacked on top of each other to output directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In this case, the first photoluminescent layer and the first periodic structure may together satisfy the conditions corresponding to inequality (15), whereas the second photoluminescent layer and the second periodic structure may together satisfy the conditions corresponding to inequality (15). For a structure including three or more layers, the photoluminescent layer and the periodic structure in each layer may satisfy the conditions corresponding to inequality (15). The positional relationship between the photoluminescent layers and the periodic structures in FIG. 22 may be reversed. Although the layers illustrated by the example in FIG. 22 have different periods, they may all have the same period. In this case, although the spectrum cannot be broadened, the emission intensity can be increased.

5-7. Structure Including Protective Layer

Figure 23:
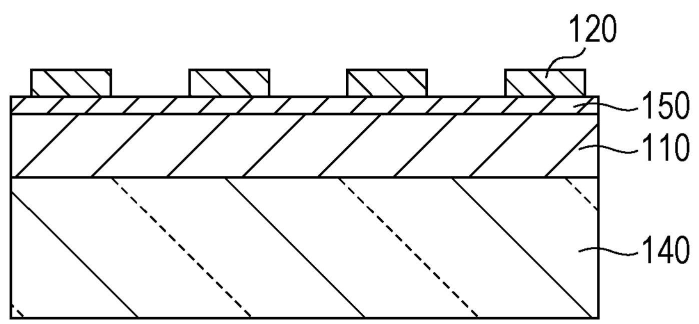
FIG. 23 is a sectional view of an example structure including a protective layer between the photoluminescent layer and the periodic structure.

FIG. 23 is a sectional view of an example structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of the light leaks into the protective layer 150 only by about half the wavelength. Thus, if the protective layer 150 is thicker than the wavelength, no light reaches the periodic structure 120. As a result, there is no quasi-guided mode, and the function of outputting light in a particular direction cannot be achieved. If the protective layer 150 has a refractive index higher than or similar to that of the photoluminescent layer 110, the light reaches the interior of the protective layer 150; therefore, there is no limitation on the thickness of the protective layer 150. Nevertheless, a thinner protective layer 150 is desirable because more light is output if most of the portion in which light is guided (this portion is hereinafter referred to as "waveguide layer") is made of a photoluminescent material. The protective layer 150 may be made of the same material as the periodic structure (light-transmissive layer) 120. In this case, the light-transmissive layer 120 having the periodic structure functions as a protective layer. The light-transmissive layer 120 desirably has a lower refractive index than the photoluminescent layer 110.

6. Material and Method of Manufacture

Directional light emission can be achieved if the photoluminescent layer (or waveguide layer) and the periodic structure are made of materials that satisfy the above conditions. The periodic structure may be made of any material. However, a photoluminescent layer (or waveguide layer) or a periodic structure made of a medium with high light absorption is less effective in confining light and therefore results in a lower peak intensity and Q value. Thus, the photoluminescent layer (or waveguide layer) and the periodic structure may be made of media with relatively low light absorption.

For example, the periodic structure may be made of a dielectric with low light absorption. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentaoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins are desirably used, which have refractive indices of about 1.3 to 1.5.

The term "photoluminescent material" encompasses fluorescent materials and phosphorescent materials in a narrow sense, encompasses inorganic materials and organic materials (e.g., dyes), and encompasses quantum dots (i.e., tiny semiconductor particles). In general, a fluorescent material containing an inorganic host material tends to have a higher refractive index. Examples of fluorescent materials that emit blue light include $M_{10}(PO_4)_6Cl_2:Eu^{2+}$ (where M is at least one element selected from Ba, Sr, and Ca), $BaMgAl_{10}O_{17}:Eu^{2+}$, $M_3MgSi_2O_8:Eu^{2+}$ (where M is at least one element selected from Ba, Sr, and Ca), and $M_5SiO_4Cl_6:Eu^{2+}$ (where M is at least one element selected from Ba, Sr, and Ca). Examples of fluorescent materials that emit green light include $M_2MgSi_2O_7:Eu^{2+}$ (where M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (where M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and $\beta$-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (where M is at least one element selected from Ba, Sr, and Ca), $MSiN_2:Eu^{2+}$ (where M is at least one element selected from Ba, Sr, and Ca), $MSi_2O_2N_2:Yb^{2+}$ (where M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (where M is at least one element selected from Ba, Sr, and Ca), and $M_3SiO_5:Eu^{2+}$ (where M is at least one element selected from Ba, Sr, and Ca). Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, $\alpha$-SiAlON:$Eu^{2+}$, $MSi_2O_2N_2:Eu^{2+}$ (where M is at least one element selected from Ba, Sr, and Ca), and $M_7(SiO_3)_6Cl_2:Eu^{2+}$ (where M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as shown in, for example, FIGS. 1C and 1D, is made of a light-transmissive material having a lower refractive index than the photoluminescent layer 110. Examples of such materials include $MgF_2$, LiF, $CaF_2$, $SiO_2$, glasses, and resins.

Example methods of manufacture will now be described.

Figure 24:
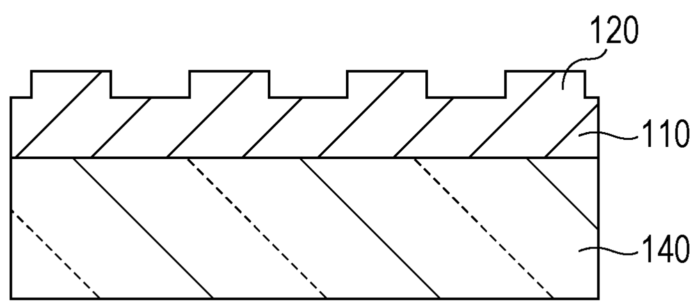
FIG. 24 is an example where the periodic structure is formed by partially processing the photoluminescent layer.

An example method for manufacturing the structure shown in FIGS. 1C and 1D includes depositing a thin film of fluorescent material on the transparent substrate 140 by a process such as evaporation, sputtering, or coating to form the photoluminescent layer 110 and then depositing a dielectric and patterning it by a process such as photolithography to form the periodic structure 120. Alternatively, the periodic structure 120 may be formed by nanoimprinting. As shown in FIG. 24, the periodic structure 120 may also be formed by partially processing the photoluminescent layer 110. In this case, the periodic structure 120 is made of the same material as the photoluminescent layer 110.

The light-emitting device 100 shown in FIGS. 1A and 1B can be manufactured, for example, by fabricating the light-emitting device 100*a* shown in FIGS. 1C and 1D and then stripping the photoluminescent layer 110 and the periodic structure 120 from the substrate 140.

The structure shown in FIG. 19A can be manufactured, for example, by forming the periodic structure 120*a* on the transparent substrate 140 by a process such as a semiconductor process or nanoimprinting and then depositing thereon the material for the photoluminescent layer 110 by a process such as evaporation or sputtering. The structure shown in FIG. 19B can be manufactured by filling the recesses in the periodic structure 120*a* with the photoluminescent layer 110 by a process such as coating.

The above methods of manufacture are for illustrative purposes only, and the light-emitting devices according to the embodiments of the present disclosure may be manufactured by other methods.

Examples

Light-emitting devices according to embodiments of the present disclosure are illustrated by the following examples.

A sample light-emitting device having the same structure as in FIG. 19A was fabricated and evaluated for its properties. The light-emitting device was fabricated as follows.

Figure 25:
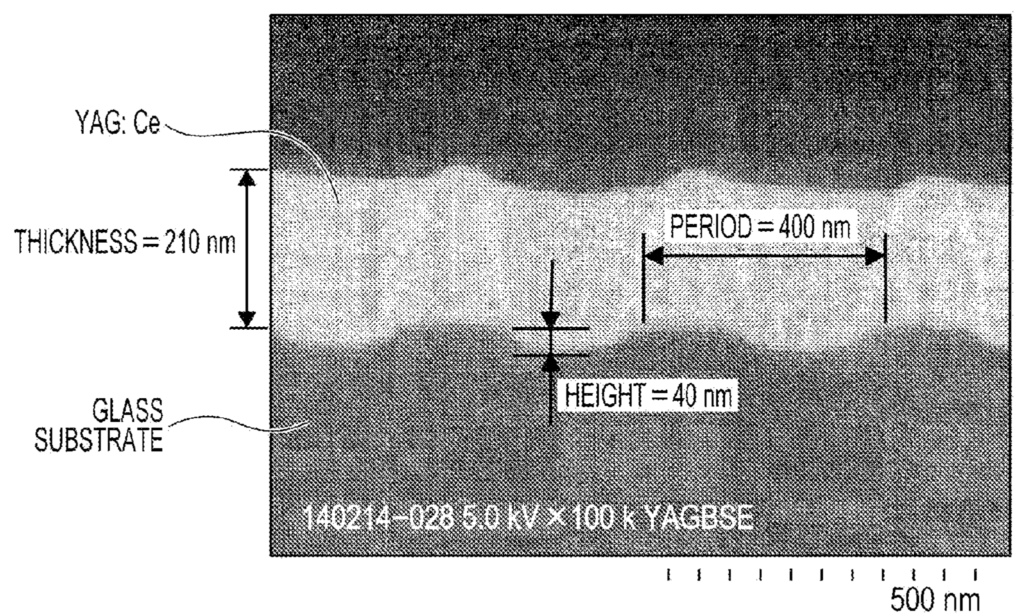
FIG. 25 is a cross-sectional transmission electron microscopy (TEM) image of a photoluminescent layer formed on a glass substrate having a periodic structure.
Figure 26:
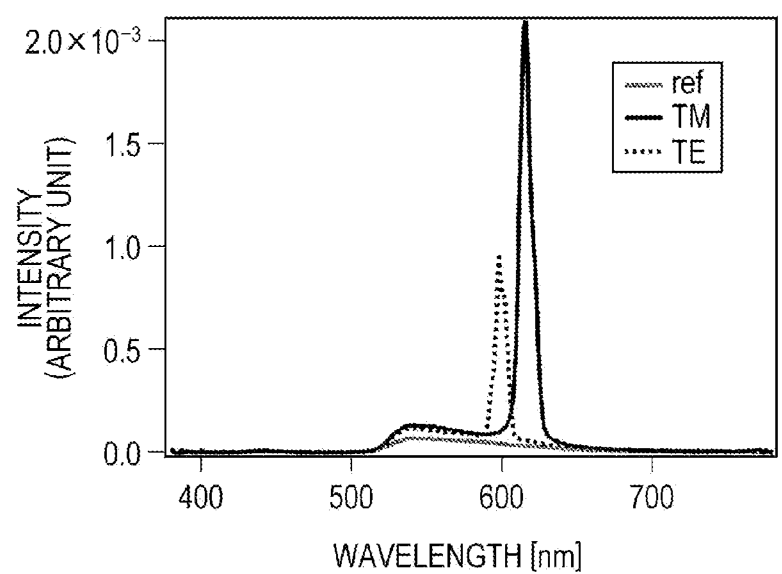
FIG. 26 is a graph showing the results of measurements of the spectrum of light output from a sample light-emitting device in the front direction.

A one-dimensional periodic structure (stripe-shaped projections) having a period of 400 nm and a height of 40 nm was formed on a glass substrate, and a photoluminescent material, i.e., YAG:Ce, was deposited thereon to a thickness of 210 nm. FIG. 25 shows a cross-sectional transmission electron microscopy (TEM) image of the resulting light-emitting device. FIG. 26 shows the results of measurements of the spectrum of light output from the light-emitting device in the front direction when YAG:Ce was excited with an LED having an emission wavelength of 450 nm. FIG. 26 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater for the TM mode, which has a polarization component parallel to the one-dimensional periodic structure.

Figures 27A, 27B:
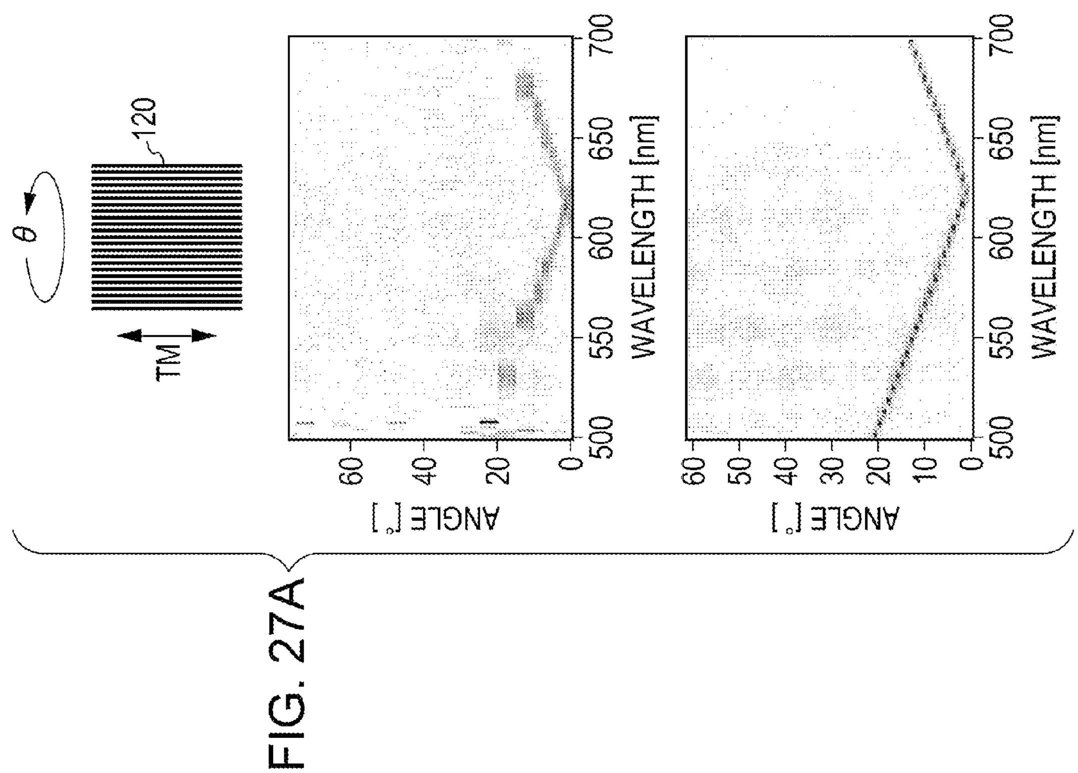
FIGS. 27A and 27B are graphs showing the results of measurements (top) and calculations (bottom) of the angular dependence of light output from the sample light-emitting device.
Figure 28A:
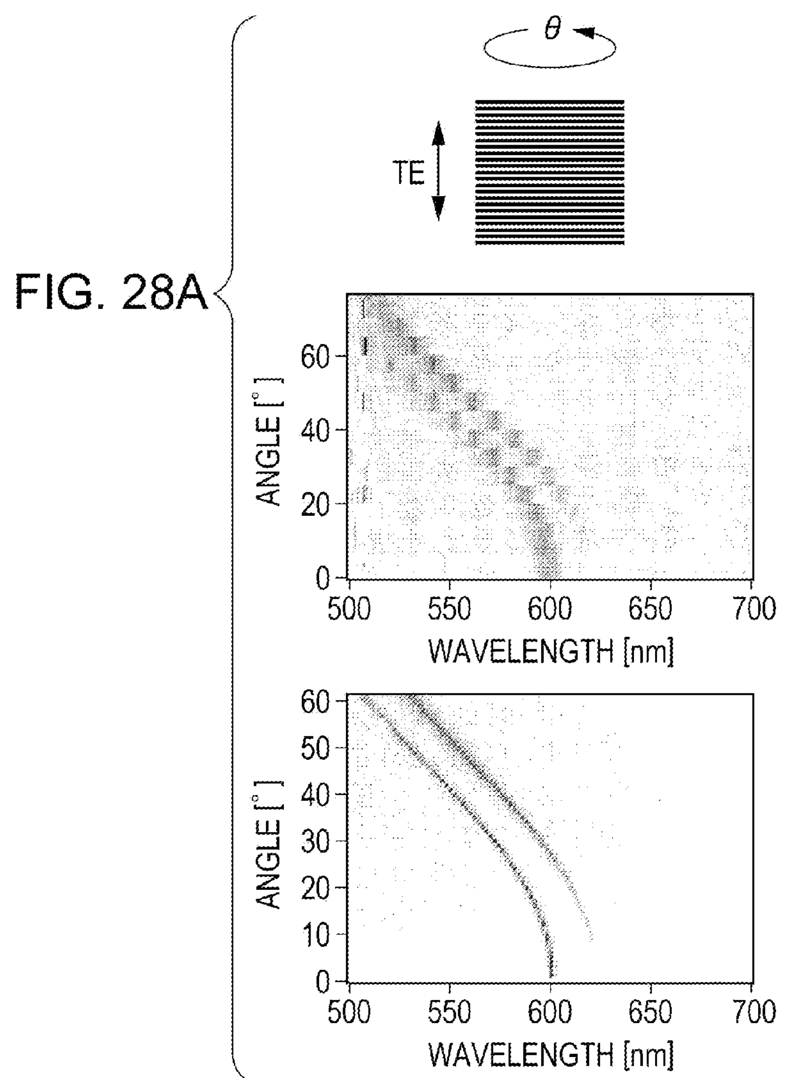
FIGS. 28A and 28B are graphs showing the results of measurements (top) and calculations (bottom) of the angular dependence of the light output from the sample light-emitting device.
Figure 28B:
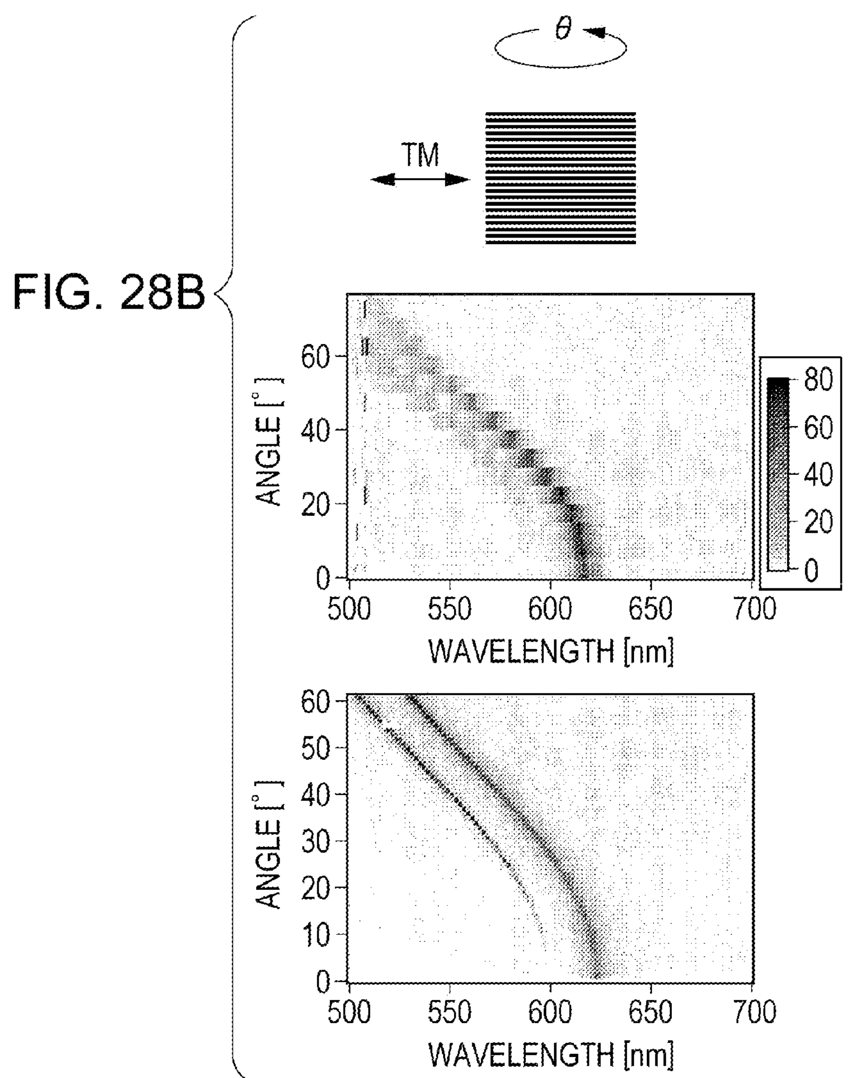

FIGS. 27A, 27B, 28A, and 28B show the results of measurements and calculations of the angular dependence of the intensity of light output from the same sample. FIGS. 27A and 27B show the results of measurements (top) and calculations (bottom) for rotation about an axis parallel to the line direction of the one-dimensional periodic structure (i.e., the periodic structure 120). FIGS. 28A and 28B show the results of measurements (top) and calculations (bottom) for rotation about an axis perpendicular to the line direction of the one-dimensional periodic structure (i.e., the periodic structure 120). FIGS. 27A, 27B, 28A, and 28B show the results for linearly polarized light in the TM mode and the TE mode. FIG. 27A shows the results for linearly polarized light in the TM mode. FIG. 27B shows the results for linearly polarized light in the TE mode. FIG. 28A shows the results for linearly polarized light in the TE mode. FIG. 28B shows the results for linearly polarized light in the TM mode. As can be seen from FIGS. 27A, 27B, 28A, and 28B, the enhancement effect is greater for the TM mode, and the enhanced wavelength shifts with angle. For example, light of a wavelength of 610 nm is observed only in the TM mode and in the front direction, indicating that the light is directional and polarized. In addition, the top and bottom parts of each figure match each other. Thus, the validity of the above calculations was experimentally demonstrated.

Figure 29:
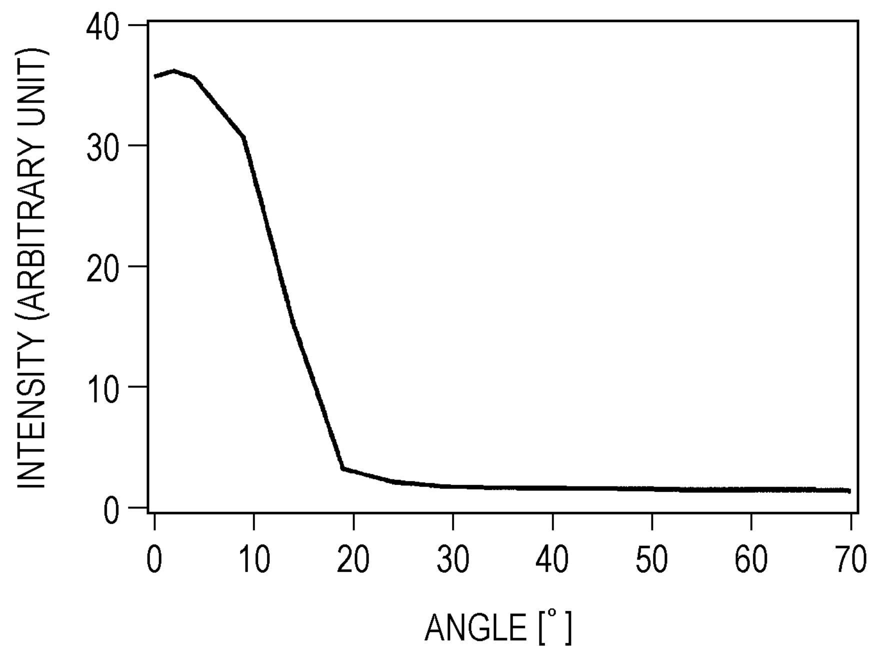
FIG. 29 is a graph showing the results of measurements of the angular dependence of light (wavelength: 610 nm) output from the sample light-emitting device.

Among the above results of measurements, for example, FIG. 29 shows the angular dependence of the intensity of light of a wavelength of 610 nm for rotation about an axis perpendicular to the line direction. As shown in FIG. 29, the light was significantly enhanced in the front direction and was little enhanced at other angles. The angle of directionality of the light output in the front direction is less than 15°. The angle of directionality is the angle at which the intensity is 50% of the maximum intensity and is expressed as the angle of one side with respect to the direction with the maximum intensity. This demonstrates that directional light emission was achieved. In addition, all the light was the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

Whereas the foregoing embodiments of the present disclosure mainly illustrate light-emitting devices including a periodic submicron structure, the following embodiments illustrate light-emitting devices including a submicron structure composed of irregularly (i.e., randomly) arranged projections and/or recesses. As used herein, the term "arrangement of projections and/or recesses" refers to the two-dimensional arrangement of projections and/or recesses as viewed in the direction normal to the plane in which the submicron structure is formed, typically in the direction normal to the photoluminescent layer.

A submicron structure including irregularly arranged projections and/or recesses is hereinafter referred to as "random submicron structure". A random arrangement of projections and/or recesses is hereinafter referred to as "random pattern". The random submicron structure is defined on the photoluminescent layer and/or the light-transmissive layer, as are the submicron structures (periodic structures) described above. A light-emitting device including a random submicron structure can output light in a broad wavelength range. The term "random" as used herein does not necessarily mean complete randomness, but encompasses any level of irregularity sufficient to provide the above effects such as emission enhancement in a broad wavelength range, as will be apparent from the following description.

Although the following embodiments illustrate light-emitting devices including a light-transmissive layer having a random submicron structure on a photoluminescent layer, other structures are possible. For example, the light-emitting devices according to the foregoing embodiments of the present disclosure may include a random submicron structure.

Example random patterns of submicron structures of light-emitting devices according to embodiments of the present disclosure will now be described with reference to FIGS. 31A to 38C.

Figure 31A:
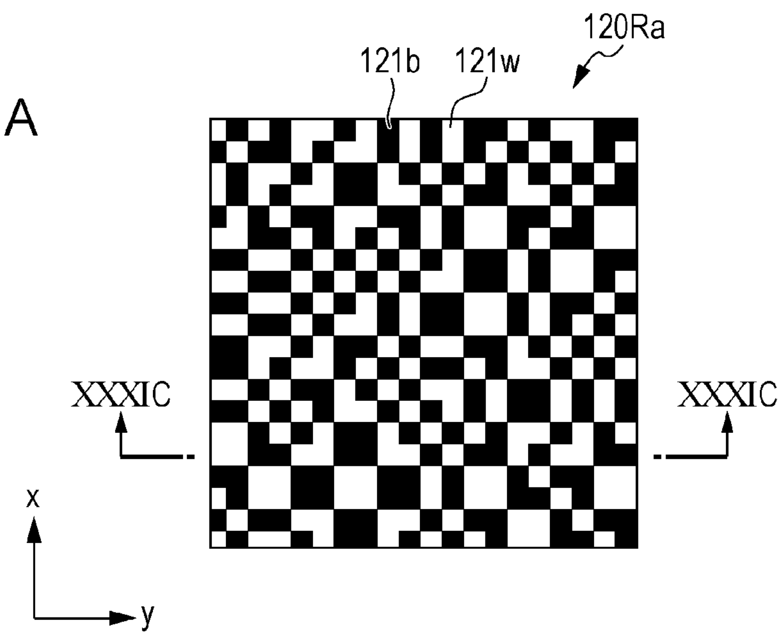
FIG. 31A is a schematic plan view of a submicron structure having a first random pattern.
Figure 31B:
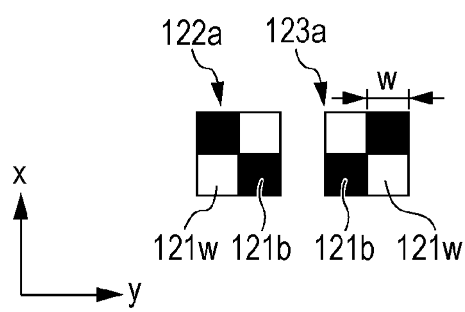
FIG. 31B is a plan view of a first unit pattern and a second unit pattern that form the first random pattern.
Figure 31C:
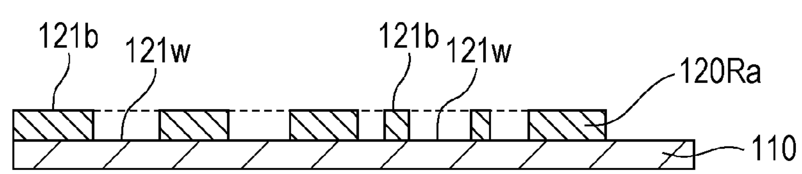
FIG. 31C is a sectional view of the light-emitting device taken along line XXXIC-XXXIC in FIG. 31A.

FIG. 31A is a schematic plan view of a submicron structure 120Ra having a first random pattern. FIG. 31B is a plan view of a first unit pattern 122*a* and a second unit pattern 123*a* that form the first random pattern. FIG. 31C is a sectional view of the light-emitting device taken along line XXXIC-XXXIC in FIG. 31A. Although the light-emitting device illustrated herein includes a photoluminescent layer 110 and a submicron structure (light-transmissive layer) 120Ra formed on the photoluminescent layer 110, other structures are possible. For example, it should be appreciated that the light-emitting device may include the substrate 140 shown in FIGS. 1C and 1D.

As shown in FIG. 31A, the submicron structure 120Ra includes first areas (indicated by the black regions) 121*b* and second areas (indicated by the white regions) 121*w*. The first areas 121*b* and the second areas 121*w* are randomly arranged. The arrangement of the first areas 121*b* and the second areas 121*w* can be formed, for example, by arranging the two types of unit patterns 122*a* and 123*a* shown in FIG. 31B in various combinations.

The first unit pattern 122*a* and the second unit pattern 123*a* are square, each including two first areas 121*b* and two second areas 121*w*. The first areas 121*b* and the second areas 121*w* are squares with a length of w on each side. The first unit pattern 122*a* and the second unit pattern 123*a* are squares with a length of 2w on each side. If the four areas that form the first unit pattern 122*a* and the second unit pattern 123*a* are assumed to be first to fourth quadrants, the first unit pattern 122*a* has the second areas 121*w* in the first and third quadrants and the first areas 121*b* in the second and fourth quadrants. The second unit pattern 123*a* is given by interchanging the first areas 121*b* and the second areas 121*w* in the first unit pattern 122*a*.

For example, as shown in FIG. 31C, the first areas 121*b* are defined by projections 121*b*, whereas the second areas 121*w* are defined by recesses 121*w*. The projections 121*b* and the recesses 121*w* are indicated by the same reference numerals as the first areas 121*b* and the second areas 121*w*, respectively.

The size w of the projections 121*b* and the recesses 121*w* that form the submicron structure 120Ra having the first random pattern shown in FIG. 31A is half the minimum center-to-center distance $D_{int}$ between adjacent projections 121*b* or recesses 121*w* (hereinafter denoted as "$D_{int}$(min)"). Hence, 2w=$D_{int}$(min). This is also true for the other random patterns illustrated below.

The projections 121*b* have a flat top surface. The recesses 121*w* illustrated herein have a flat bottom surface defined by the photoluminescent layer 110. The top surfaces of the projections 121*b* and the bottom surfaces of the recesses 121*w* form two levels of height in the thickness direction. The top surfaces of the projections 121*b* and the bottom surfaces of the recesses 121*w* may be any surfaces that allow the two different levels of height to be distinguished. Specifically, the top surfaces of the projections 121*b* and the bottom surfaces of the recesses 121*w* may be any surfaces that have a surface roughness sufficiently lower than the difference between the two levels of height (i.e., the thickness of the projections 121*b*), for example, 10% or less of the difference between the two levels of height. Having such a pattern with two levels of height, the submicron structure 120Ra is advantageous in that it can be easily manufactured by a semiconductor manufacturing process.

The recesses 121*w* need not extend through the light-transmissive layer 120Ra, but may be formed as depressions in the light-transmissive layer 120Ra. A surface protective layer may be provided over the light-transmissive layer 120Ra. In this case, the surface protective layer desirably has a lower refractive index than the light-transmissive layer 120Ra.

The random pattern of the projections 121*b* and the recesses 121*w* in the submicron structure 120Ra can be formed, for example, by randomly selecting and sequentially arranging first unit patterns 122*a* and second unit patterns 123*a*. For example, the methods disclosed in Japanese Unexamined Patent Application Publication Nos. 2011-118327 and 2011-118328 may be used, the entire contents of which are incorporated herein by reference.

The first random pattern shown in FIG. 31A has a probability of occurrence of the first unit patterns 122*a* of 50% (i.e., a probability of occurrence of the second unit patterns 123*a* of 50%). This pattern has the highest randomness of the patterns that can be formed by two types of unit patterns.

A random pattern is characterized by the "spatial frequency", which is determined by the Fourier transform of the pattern, and the "period", which is given as the reciprocal of the spatial frequency. "Fourier transform of the pattern" means that for example, the shift in the phase of light due to the first areas 121*b* and the second areas 121*w* in the first random pattern of the submicron structure 120Ra is expressed as a two-dimensional function of the coordinates x and y in the plane of the submicron structure 120Ra by Fourier transform (i.e., two-dimensional Fourier transform). Because the first areas 121*b* are the projections 121*b* and the second areas 121*w* are the recesses 121*w*, the Fourier transform of the pattern illustrated herein is the Fourier transform of the two-dimensional distribution of the height of the flat portions of the submicron structure 120Ra.

Figure 32A:
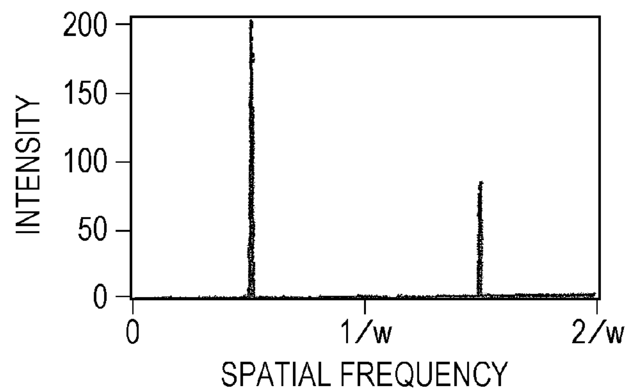
FIGS. 32A to 32D are graphs showing the distributions, in a particular direction, of intensity (i.e., the square of the absolute value of the amplitude) of spatial frequency components determined by the two-dimensional Fourier transform of patterns with different probabilities of occurrence of first unit patterns and second unit patterns.
Figure 32B:
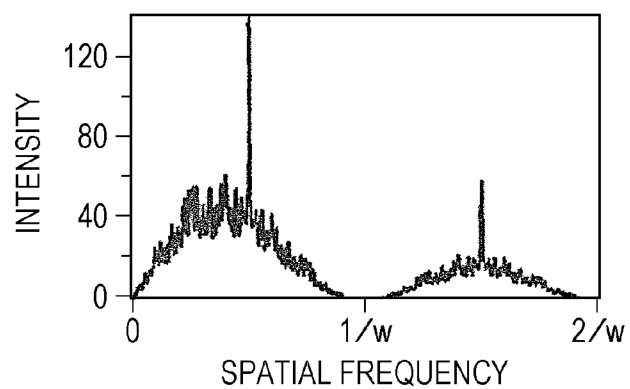
Figure 32C:
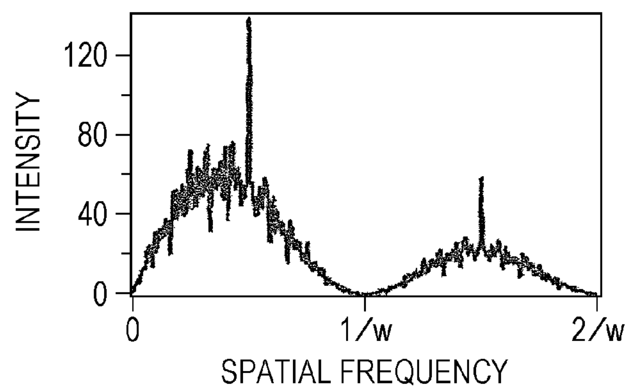
Figure 32D:
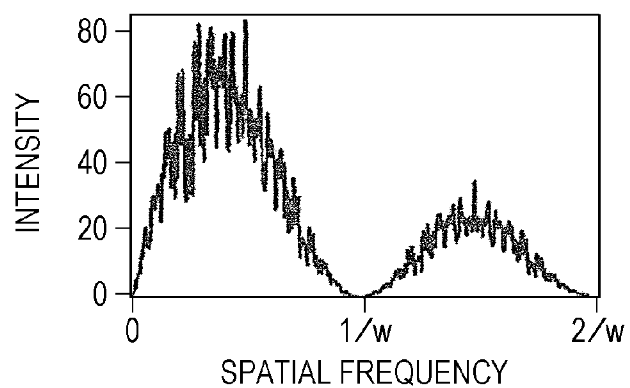
Figure 34A:
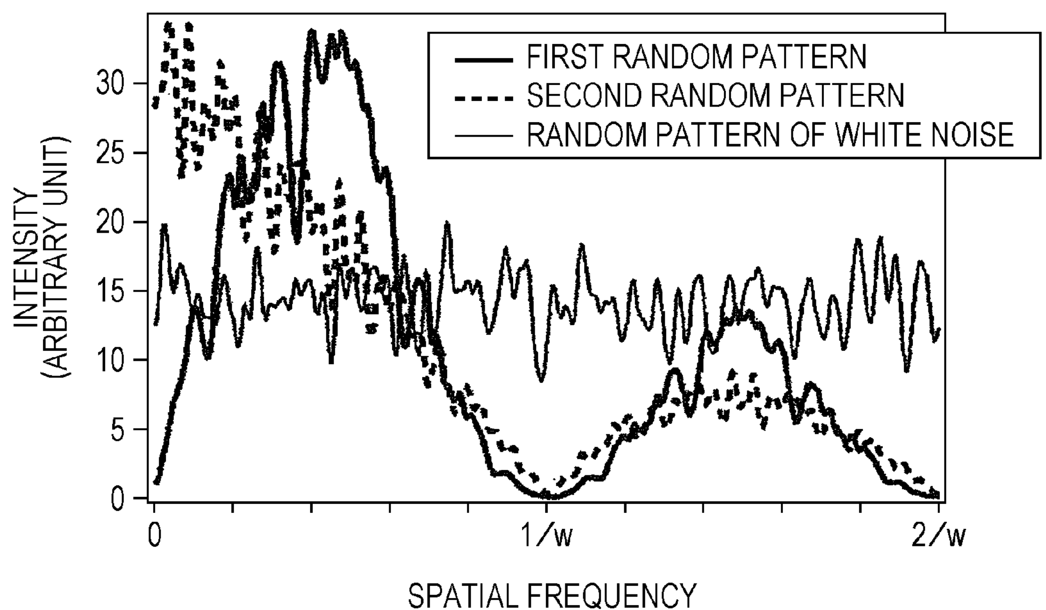
FIG. 34A is a graph showing the distribution, in a particular direction, of intensity of spatial frequency components determined by the two-dimensional Fourier transform of the three random patterns.

FIGS. 32A to 32D are graphs showing the distributions, in a particular direction, of intensity (i.e., the square of the absolute value of the amplitude) of spatial frequency components determined by the two-dimensional Fourier transform of patterns with different probabilities of occurrence of the first unit patterns 122*a* and the second unit patterns 123*a*. FIG. 32A shows the distribution for a pattern with a probability of occurrence of the first unit patterns 122*a* of 100%. FIG. 32B shows the distribution for a pattern with a probability of occurrence of the first unit patterns 122*a* of 80%. FIG. 32C shows the distribution for a pattern with a probability of occurrence of the first unit patterns 122*a* of 70%. FIG. 32D shows the distribution for a pattern with a probability of occurrence of the first unit patterns 122*a* of 60%. The distribution, in a particular direction, of intensity of spatial frequency components of the first random pattern shown in FIG. 31A (i.e., with a probability of occurrence of the first unit patterns 122*a* of 50%) is shown in FIG. 34A.

As shown in FIG. 32A, the pattern with a probability of occurrence of the first unit patterns 122*a* of 100% has high periodicity. The distribution of intensity of spatial frequency components has sharp peaks at particular spatial frequencies corresponding to the period. The intensities at other spatial frequencies are nearly zero, which indicates substantially no randomness. As shown in FIGS. 32B, 32C, and 32D, as the probability of occurrence of the first unit patterns 122$a$ decreases to 80%, 70%, and 60% (i.e., approaches 50%), non-zero intensities appear over a wider range of spatial frequencies, which indicates increased randomness. Specifically, the gentle hillock in the range of spatial frequencies from near 0 to near 1/w and the gentle hillock in the range of spatial frequencies from near 1/w to near 2/w become larger as the probability of occurrence of the first unit patterns 122$a$ decreases (i.e., approaches 50%). In contrast, the sharp peaks at the particular spatial frequencies derived from the periodicity become smaller as the probability of occurrence of the first unit patterns 122$a$ decreases (i.e., approaches 50%) and almost disappear at 60% (FIG. 32D). The randomness of a pattern formed by a combination of only two types of unit patterns is highest when the probability of occurrence is 50%, i.e., when the two types of unit patterns occur in equal numbers. Hence, the first random pattern shown in FIG. 31A has the highest randomness of the patterns that can be formed by the first unit patterns 122$a$ and the second unit patterns 123$a$ shown in FIG. 31B. The term "random pattern" as used herein encompasses not only the pattern shown in FIG. 31A, but also patterns having spatial frequency components distributed at least from near 0 to near 1/w, as in the distributions of intensity of spatial frequency components in FIGS. 32B to 32D. These spatial frequency components correspond to the first-order component for a diffraction grating, and the components distributed from 1/w to 2/w correspond to the second-order component. The second-order component has a limited influence because it has a lower intensity than the first-order component. In the figures, the third- and higher-order components are not shown. When expressed using $D_{int}$(min) instead of w based on the relationship 2w=$D_{int}$(min), the term "random pattern" as used herein encompasses patterns having spatial frequency components distributed from more than 0 to 2/$D_{int}$(min). By "spatial frequency components distributed from more than 0 to 2/$D_{int}$(min)", it is meant that the intensities near spatial frequencies of 0 and 2/$D_{int}$(min) are substantially not zero. A pattern having a significantly high intensity (i.e., a sharp peak) at a spatial frequency corresponding to a particular period, as shown in FIGS. 32B and 32C, shows intermediate properties between a random structure and a periodic structure and is therefore undesirable for providing the effects such as emission enhancement in a broad wavelength range.

Figures 33A, 33B:
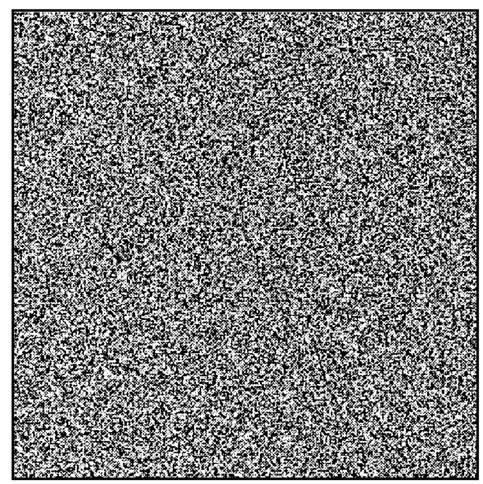
FIG. 33A is a schematic plan view of a submicron structure having a second random pattern.
FIG. 33B is a schematic plan view of an example random pattern of white noise.

Reference is now made to FIGS. 33A and 33B. FIG. 33A is a schematic plan view of a submicron structure 120Rb having a second random pattern. FIG. 33B is a schematic plan view of an example random pattern of white noise.

The second random pattern shown in FIG. 33A can be formed using first unit patterns 122$b$ and second unit patterns 123$a$ shown in FIG. 33A instead of the first unit patterns 122$a$ and the second unit patterns 123$a$ in the first random pattern. The first unit patterns 122$b$ are squares with a length of w on each side that are formed only by the first areas 121$b$. The second unit patterns 123$b$ are squares with a length of w on each side that are formed only by the second areas 121$w$.

FIG. 33B shows a random pattern of white noise, i.e., a pattern in which structures of random sizes are arranged at random positions. That is, the random pattern of white noise is a structure in which interfaces are present at random positions without regularity in all directions in a plane. For example, the random pattern of white noise can be formed by the texture of a rough surface.

Figure 34B:
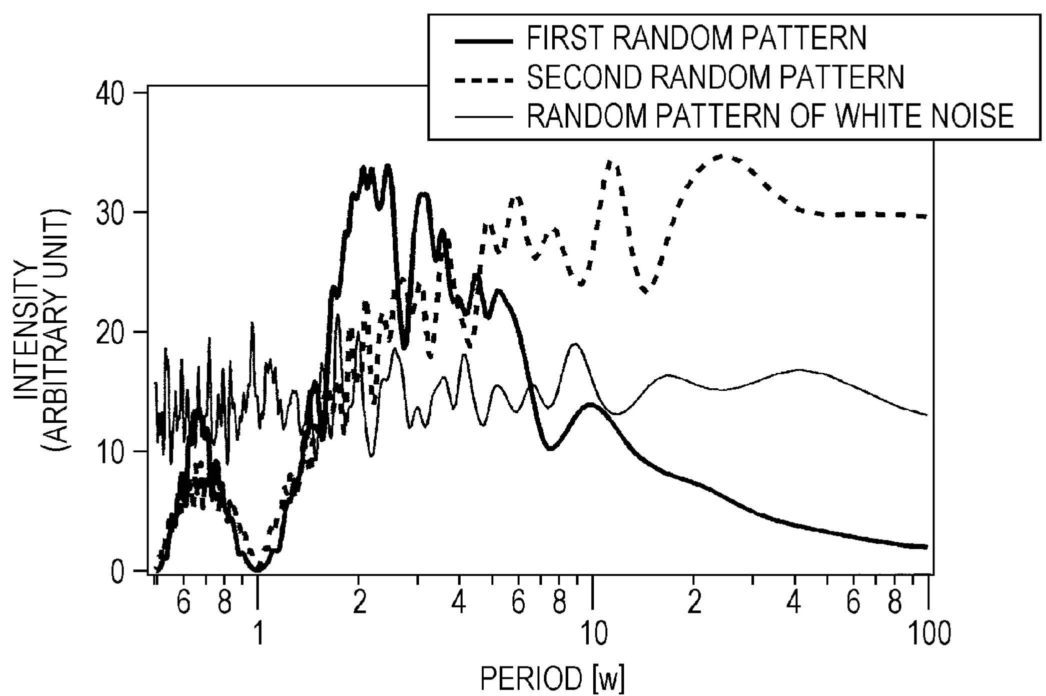
FIG. 34B is a graph given by converting the horizontal axis of FIG. 34A to the period (unit: w)

These three random patterns will now be compared with reference to FIGS. 34A and 34B.

FIG. 34A shows the one-dimensional distributions of intensity of spatial frequency components in a particular direction from the distributions of intensity of spatial frequency components determined by the two-dimensional Fourier transform of the first random pattern, the second random pattern, and the random pattern of white noise. In FIG. 34A, the horizontal axis indicates the spatial frequency of the patterns (normalized by w), and the vertical axis indicates the intensity (i.e., the square of the absolute value of the amplitude) at each spatial frequency in arbitrary units. The thick solid line indicates the one-dimensional distribution of intensity of spatial frequency components of the first random pattern shown in FIG. 31A. The dashed line indicates the one-dimensional distribution of intensity of spatial frequency components of the second random pattern shown in FIG. 33A. The thin solid line indicates the one-dimensional distribution of intensity of spatial frequency components of the random pattern of white noise shown in FIG. 33B. FIG. 34B is a graph given by converting the horizontal axis of FIG. 34A to the period (unit: w).

As shown in FIG. 34A, the random pattern of white noise has a substantially constant intensity over a wide range of spatial frequencies (i.e., from more than 0 to less than 2/w). In other words, as can be seen from FIG. 34B, the random pattern of white noise has a substantially constant intensity over a wide range of periods (i.e., from more than 0.5w to 100w). When expressed using $D_{int}$(min) instead of w based on the relationship 2w=$D_{int}$(min), the random pattern of white noise has a substantially constant intensity over a wide range of spatial frequencies (i.e., from more than 0 to less than 4/$D_{int}$(min)) (FIG. 34A). In other words, the random pattern of white noise has a substantially constant intensity over a wide range of periods (i.e., from more than 0 to 50w$D_{int}$(min)) (FIG. 34B).

Thus, a pattern of white noise that satisfies the relationship $\lambda_a/n_{wav\text{-}a}<D_{int}(\min)=2w<\lambda_a$ (which is given by replacing $\lambda_0$ by $\lambda_a$ and p by $D_{int}$(min) in inequality (12)) includes $D_{int}$ that satisfies the relationship $\lambda_a/n_{wav\text{-}a}<D_{int}=2w<\lambda_a$, but in a small proportion; it includes a large proportion of $D_{int}$ that does not satisfy the relationship $\lambda_a/n_{wav\text{-}a}<D_{int}=2w<\lambda_a$. For this pattern, the effects such as emission enhancement in the front direction are negligible.

As shown in FIG. 34A, the second random pattern shown in FIG. 33A has low intensities near a spatial frequency of 1/w. As shown in FIG. 34B, the second random pattern has lower intensities than the random pattern of white noise at periods of 1.6w or less.

As shown in FIG. 34A, the second random pattern has lower intensities than the random pattern of white noise above a spatial frequency of 0.6/w and higher intensities than the random pattern of white noise below a spatial frequency of 0.6/w. As shown in FIG. 34B, the second random pattern has higher intensities than the random pattern of white noise above a spatial frequency of 1.6w and lower intensities than the random pattern of white noise below a spatial frequency of 1.6w. Thus, the second random pattern shown in FIG. 33A includes a large proportion of periodic structures with periods of more than 1.6w.

To efficiently produce the effects such as emission enhancement using the second random pattern, w (=$D_{int}$ (min)/2) may be set such that a larger proportion of $D_{int}$ satisfies the relationship $\lambda_a/n_{wav\text{-}a}<D_{int}=2w<\lambda_a$. Because the second random pattern includes a large proportion of periodic structures with periods of more than 1.6w, w (=$D_{int}$(min)/2) may be set so as to satisfy the relationship 1.6w<$\lambda_a/n_{wav-a}$, i.e., 0.8$D_{int}$(min)<$\lambda_a/n_{wav-a}$.

As shown in FIG. 34A, the first random pattern has lower intensities than the random pattern of white noise above a spatial frequency of 0.6/w and below a spatial frequency of 0.16/w. The first random pattern has higher intensities at spatial frequencies of 0.16/w to 0.6/w and the maximum intensity at a spatial frequency of 0.5/w. As shown in FIG. 34B, the first random pattern includes a significantly larger proportion of periodic structures with periods of 1.6w to 6w than the other random patterns, and periodic structures with a period of 2w are present in the largest proportion.

Figure 35A:
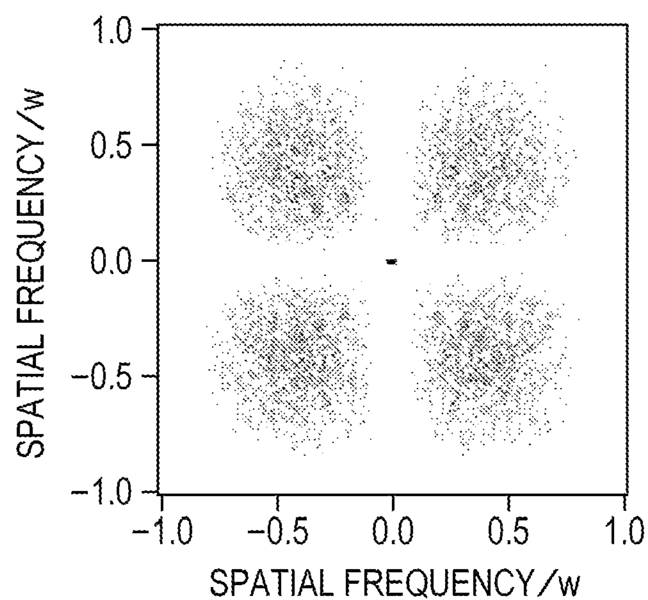
FIG. 35A is a graph showing the distribution of intensity of spatial frequency components determined by the two-dimensional Fourier transform of the first random pattern.
Figure 35B:
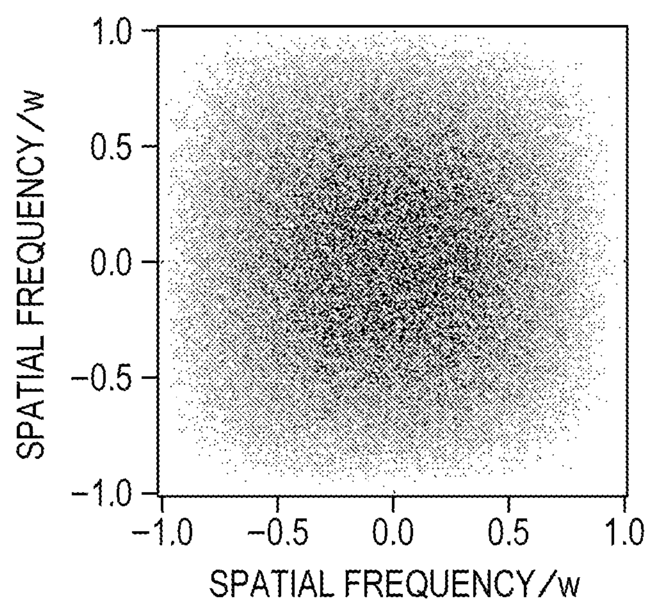
FIG. 35B is a graph showing the distribution of intensity of spatial frequency components determined by the two-dimensional Fourier transform of the second random pattern.

The characteristics of the first and second random patterns will now be described based on the results of two-dimensional Fourier transform. FIG. 35A is a graph showing the distribution of intensity of spatial frequency components determined by the two-dimensional Fourier transform of the first random pattern. FIG. 35B is a graph showing the distribution of intensity of spatial frequency components determined by the two-dimensional Fourier transform of the second random pattern. These graphs are shown with lower spatial frequencies (i.e., larger periods) near the centers of the graphs and higher spatial frequencies (i.e., smaller periods) awav from the centers of the graphs.

A comparison between FIGS. 35A and 35B shows that the first random pattern (FIG. 35A) includes a smaller proportion of periodic structures with low spatial frequencies (i.e., large periods) than the second random pattern (FIG. 35B).

To efficiently produce the effects such as emission enhancement using the first random pattern, w (=$D_{int}$(min)/2) may be set such that a larger proportion of $D_{int}$ satisfies the relationship $\lambda_a/n_{wav-a}<D_{int}=2w<\lambda_a$. Because the first random pattern includes a large proportion of periodic structures with periods of 1.6w to 6w, w (=$D_{int}$(min)/2) may be set so as to satisfy the relationship 1.6w<$\lambda_a/n_{wav-a}$, i.e., 0.8$D_{int}$(min)<$\lambda_a/n_{wav-a}$, and the relationship $\lambda_a$<6w, i.e., $\lambda_a$<3$D_{int}$(min).

If $D_{int}$(min) is set as described above, the effects such as emission enhancement produced by the first random pattern are greater than those produced by the second random pattern and the random pattern of white noise.

To efficiently produce the effects such as emission enhancement using the first random pattern, the following conditions may be set.

$D_{int}$(min) may be set such that the period ($P_{max}$) corresponding to the spatial frequency that gives the maximum intensity in the distribution of intensity of spatial frequency components satisfies the relationship $\lambda_a/n_{wav-a}<P_{max}<\lambda_a$. Because the first random pattern has the maximum intensity at a spatial frequency of 0.5/w, as described above with reference to FIG. 34A, $P_{max}$=2w=$D_{int}$(min). Thus, the relationship $\lambda_a/n_{wav-a}<D_{int}(min)<\lambda_a$ may be satisfied.

Alternatively, the average period ($P_{avg}$) may be used instead of $P_{max}$. The term "average period" as used herein refers to the average of the periods present in a pattern weighted by the intensities at their corresponding spatial frequencies. As described above, $P_{avg}$ can be determined from the distribution of intensity of spatial frequency components determined by the Fourier transform of the pattern. A pattern having an average period $P_{avg}$ that satisfies the relationship $\lambda_a/n_{wav-a}<P_{avg}<\lambda_a$ includes a large proportion of periods that contribute to the effects such as emission enhancement.

It should be appreciated that the conditions $\lambda_a/n_{wav-a}<P_{max}<\lambda_a$ and $\lambda_a/n_{wav-a}<P_{avg}<\lambda_a$ are not necessarily applied to the first random pattern illustrated above, but may be applied to a wide variety of other random patterns.

The random submicron structures illustrated herein are intended to describe the effects of the randomness of submicron structures. Although the illustrated submicron structures may be formed, it is not necessary to form such definite structures. For example, the shape of the projections and the recesses need not be a square, but may be a rectangle, a polygon other than a square, a circle, or an oval. The projections and the recesses need not be provided in equal numbers, but may be provided in different numbers. Although the projections and the recesses typically have the same sizes in the x direction and the y direction, they may have different sizes. The projections and the recesses may have shape variations due to the processing accuracy of the manufacturing process (e.g., round edges, sloped side surfaces, rough surfaces, and round surfaces).

Figure 36A:
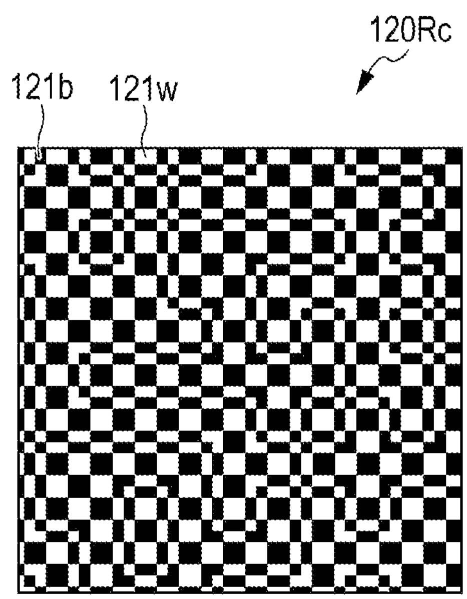
FIG. 36A is a schematic plan view of a submicron structure having a third random pattern.
Figure 37A:
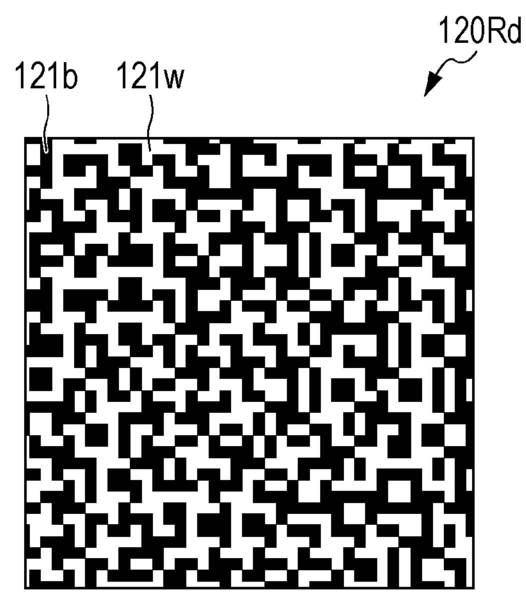
FIG. 37A is a schematic plan view of a submicron structure having a fourth random pattern.
Figure 38A:
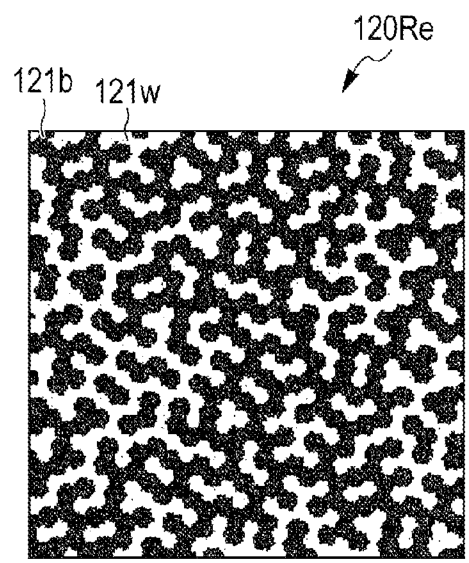
FIG. 38A is a schematic plan view of a submicron structure having a fifth random pattern.
Figure 38B:
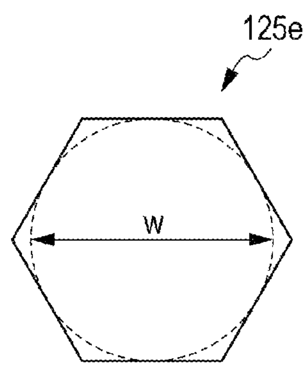
FIG. 38B is a plan view of a unit pattern that forms the fifth random pattern.

Submicron structures 120Rc, 120Rd, and 120Re shown in FIGS. 36A, 37A, and 38A, respectively, have the same advantages as the submicron structure 120Ra shown in FIG. 31A.

Figure 36B:
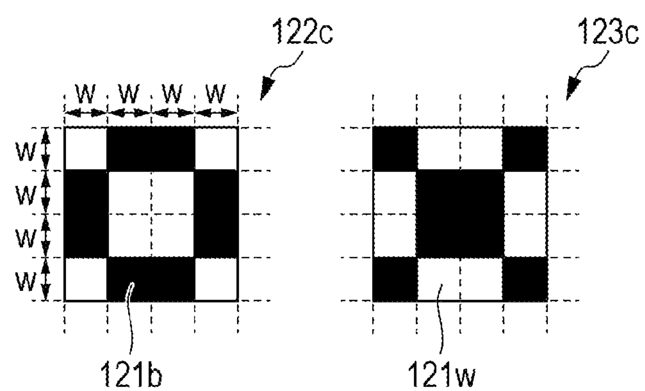
FIG. 36B is a plan view of a first unit pattern and a second unit pattern that form the third random pattern.

FIG. 36A is a schematic plan view of a submicron structure 120Rc having a third random pattern. FIG. 36B is a plan view of a first unit pattern **122*c* and a second unit pattern 123*c* that form the third random pattern. FIG. 36**C is a graph showing the distribution of intensity of spatial frequency components determined by the two-dimensional Fourier transform of the third random pattern.

The third random pattern shown in FIG. 36A can be formed using first unit patterns **122*c* and second unit patterns 123*c* shown in FIG. 36B instead of the first unit patterns 122*a* and the second unit patterns 123*a* in the first random pattern. The first unit patterns 122*c* and the second unit patterns 123*c*** are squares with a length of 4w on each side.

Figure 36C:
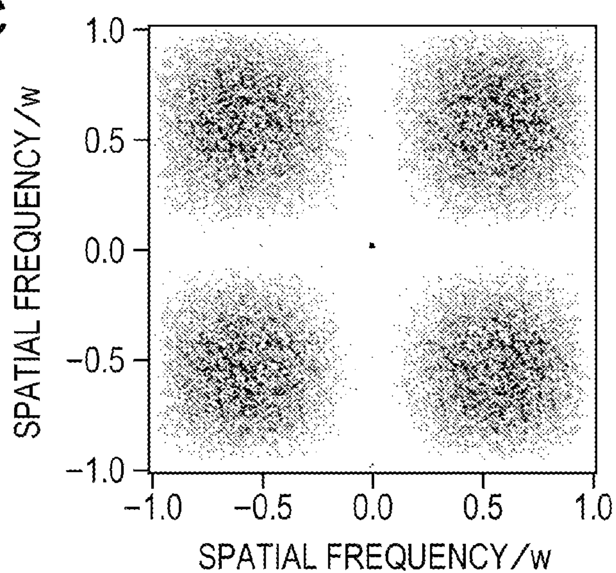
FIG. 36C is a graph showing the distribution of intensity of spatial frequency components determined by the two-dimensional Fourier transform of the third random pattern.

As shown in FIG. 36C, the third random pattern has a first intensity peak near a spatial frequency of 0.5/w, as does the first random pattern shown in FIG. 31A. Thus, the preferred range of $D_{int}$(min) of the third random pattern is similar to that of the first random pattern. The minimum center-to-center distance $D_{int}$(min) between adjacent projections or recesses corresponds to 2w.

Figure 37B:
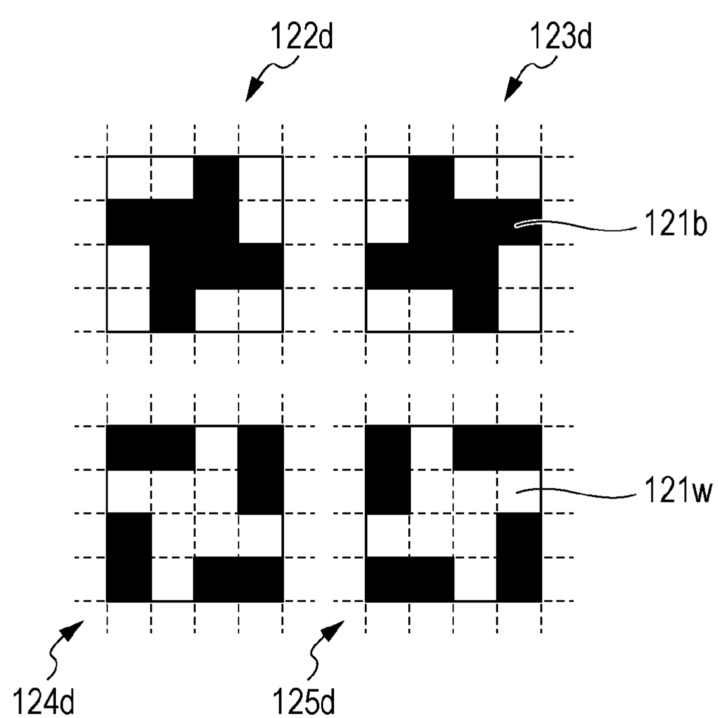
FIG. 37B is a plan view of a first unit pattern, a second unit pattern, a third unit pattern, and a fourth unit pattern that form the fourth random pattern.

FIG. 37A is a schematic plan view of a submicron structure 120Rd having a fourth random pattern. FIG. 37B is a plan view of a first unit pattern **122*d*, a second unit pattern 123*d*, a third unit pattern 124*d*, and a fourth unit pattern 125*d*** that form the fourth random pattern.

The fourth random pattern shown in FIG. 37A can be formed using first unit patterns **122*d*, second unit patterns 123*d*, third unit patterns 124*d*, and fourth unit patterns 125*d* shown in FIG. 37B instead of the first unit patterns 122*a* and the second unit patterns 123*a* in the first random pattern. The first unit patterns 122*d*, the second unit patterns 123*d*, the third unit patterns 124*d*, and the fourth unit patterns 125*d*** are squares with a length of 4w on each side.

Figure 38C:
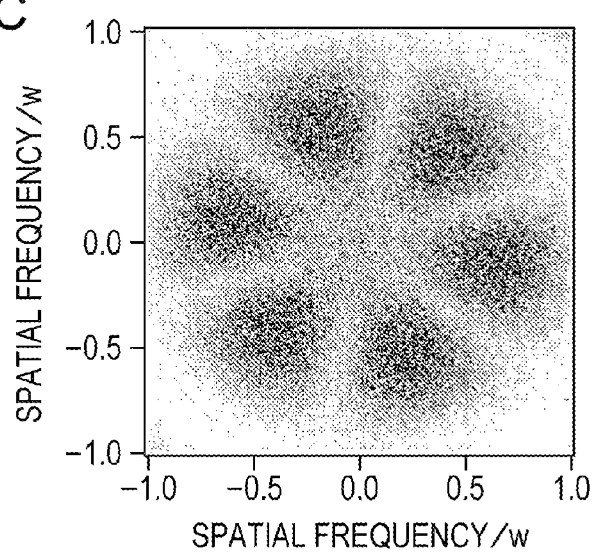
FIG. 38C is a graph showing the distribution of intensity of spatial frequency components determined by the two-dimensional Fourier transform of the fifth random pattern.

FIG. 38A is a schematic plan view of a submicron structure 120Re having a fifth random pattern. The fifth random pattern can be formed in the same manner as described above using hexagonal unit patterns **125*e* shown in FIG. 38B. This pattern is formed by randomly arranging hexagons with an inscribed circle diameter of w such that there are no four or more consecutive hexagons arranged in the same direction. FIG. 38C shows the distribution of intensity of spatial frequency components determined by two-dimensional Fourier transform. The fifth random pattern has a peak near a spatial frequency of 0.5/w, as does the first random pattern shown in FIG. 31A. This is because the pattern in FIG. 38**A, in which there are an average of nearly two consecutive hexagons arranged in the same direction, includes a large proportion of the frequency component corresponding to 2w. Thus, the preferred range of $D_{int}$(min) of the fifth random pattern is similar to that of the first random pattern.

The distribution of intensity of spatial frequency components in FIG. 38C has peaks at intervals of 60° in azimuth direction. In contrast, the distributions of intensity of spatial frequency components of the first and third random patterns shown in FIGS. 31A and 36A, as shown in FIGS. 35A and 36C, respectively, have peaks at intervals of 90° in azimuth direction. This is because the fifth random pattern shown in FIG. 38A includes hexagonal unit patterns, whereas the random patterns in FIGS. 31A and 36A include square unit patterns. A random pattern including unit patterns having a hexagonal planar shape has less variation in periodic components with azimuth direction and thus has less variation in emission enhancement with azimuth direction.

This phenomenon can also be understood as follows. A square has a diagonal length that is √2 times (i.e., $2^{1/2}$ times) the diameter of an inscribed circle, whereas a hexagon has the longest diagonal length that is 2/√3 times (i.e., $2/(3^{1/2})$ times) the diameter of an inscribed circle; therefore, a hexagon has a lower size dependence on azimuth direction. That is, the periodic components of a square pattern in the side direction and the diagonal direction differ by √2 times (i.e., $2^{1/2}$ times), whereas the periodic components of a hexagonal pattern in different directions differ only by 2/√3 times (i.e., $2/(3^{1/2})$ times). As a result, a hexagonal pattern has less variation in frequency components with azimuth direction. Thus, the fifth random pattern has less variation in emission enhancement with direction than the first and third random patterns.

The random patterns shown in FIGS. 37A and 38A, which have the same characteristics as the first and third random patterns, can more efficiently provide the effects such as emission enhancement than the second random pattern and the random pattern of white noise.

A light-emitting device according to an embodiment of the present disclosure includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses. The submicron structure has spatial frequency components distributed at least from more than 0 to $2/D_{int}$(min) as determined by two-dimensional Fourier transform of a pattern of the projections or recesses, and satisfies the following relationship:

$$\lambda_{wav\text{-}a} < D_{int}(\min) < \lambda_a$$

where $D_{int}$(min) is the minimum center-to-center distance between adjacent projections or recesses, $\lambda_a$ is the wavelength of the first light in air, and $\lambda_{wav\text{-}a}$ is the wavelength of the first light in the photoluminescent layer and the light-transmissive layer.

A light-emitting device according to another embodiment of the present disclosure includes a photoluminescent layer that emits light containing first light, and a light-transmissive layer located on or near the photoluminescent layer. A submicron structure is defined on at least one of the photoluminescent layer and the light-transmissive layer. The submicron structure may extend in a plane of the photoluminescent layer or the light-transmissive layer. The submicron structure includes at least projections or recesses and satisfies the following relationship:

$$\lambda_a/n_{wav\text{-}a} < P_{max} < \lambda_a$$

where $\lambda_a$ is the wavelength of the first light in air, $n_{wav\text{-}a}$ is the refractive index of the photoluminescent layer for the first light, and $P_{max}$ is the period corresponding to a spatial frequency that gives the maximum intensity in a distribution of intensity of spatial frequency components determined by two-dimensional Fourier transform of a pattern of the projections or recesses.

The light-emitting devices and the light-emitting apparatuses according to the embodiments of the present disclosure are applicable to various optical devices such as lighting fixtures, displays, and projectors.

What is claimed is:

1. A light-emitting device comprising:

a photoluminescent layer extending parallel to a first plane, the photoluminescent layer emitting first light having a wavelength $\lambda_a$ in air, and having a refractive index $n_{wav\text{-}a}$ for the first light; and a light-transmissive layer, on the photoluminescent layer, extending parallel to the first plane, the light-transmissive layer transmitting the first light, wherein at least one of the photoluminescent layer and the light-transmissive layer includes a submicron structure comprising projections or recesses arranged parallel to the first plane, at least one of the photoluminescent layer and the light-transmissive layer has a light emitting surface parallel to the first plane, the first light being emitted from the light emitting surface, the submicron structure includes at least first directly adjacent two of the projections or the recesses, centers of which are separated from each other by a minimum distance $D_{int}$(min) and second directly adjacent two of the projections or the recesses, centers of which are separated from each other by a distance greater than the minimum distance $D_{int}$(min), and the submicron structure satisfies $0.8D_{int}(\min) < \lambda_a/n_{wav\text{-}a}$ and $\lambda_a < 3D_{int}(\min)$.

2. A light-emitting apparatus comprising:

the light-emitting device according to claim 1; and a light source that directs excitation light into the light-emitting device.

3. The light-emitting device according to claim 1, wherein 380 nm≤$\lambda_a$≤780 nm is satisfied.

4. The light-emitting device according to claim 1, wherein the photoluminescent layer includes a phosphor.

5. A light-emitting device comprising:

a photoluminescent layer extending parallel to a first plane, the photoluminescent layer emitting first light having a wavelength λa in air, and having a refractive index $n_{wav\text{-}a}$ for the first light; and a light-transmissive layer, on the photoluminescent layer, extending parallel to the first plane, the light-transmissive layer transmitting the first light, and having a refractive index higher than the refractive index $n_{wav\text{-}a}$ of the photoluminescent layer, wherein the light-transmissive layer includes a submicron structure comprising projections or recesses arranged parallel to the first plane, a distribution of intensity in spatial frequency domain determined by two-dimensional Fourier transform of a pattern of height of the projections or recesses takes a maximum value at a spatial frequency corresponding to a period $P_{max}$, the submicron structure satisfies $\lambda_a/n_{wav\text{-}a}<P_{max}<\lambda_a$, at least one of the photoluminescent layer and the light-transmissive layer has a light emitting surface parallel to the first plane, the first light being emitted from the light emitting surface, and a distance between the submicron structure and the photoluminescent layer is more than $\lambda_a/2$.

6. The light-emitting device according to claim 5, wherein 380 nm$\leq\lambda_a\leq$780 nm is satisfied.

7. The light-emitting device according to claim 5, wherein the photoluminescent layer includes a phosphor.

* * * * *